(12) United States Patent
Chuang et al.

(10) Patent No.: US 12,720,838 B2
(45) **Date of Patent: *Aug. 25, 2026**

(54) FIELD EFFECT TRANSISTOR WITH INNER SPACER LINER LAYER AND METHOD

(71) Applicant: Taiwan Semiconductor Manufacturing Co., Ltd., Hsinchu (TW)

(72) Inventors: Tsung-Han Chuang, Hsinchu (TW); Zhi-Chang Lin, Hsinchu (TW); Shih-Cheng Chen, Hsinchu (TW); Jung-Hung Chang, Hsinchu (TW); Chien Ning Yao, Hsinchu (TW); Kuo-Cheng Chiang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 243 days.

This patent is subject to a terminal disclaimer.

(21) Appl. No.: 18/759,649

(22) Filed: Jun. 28, 2024

(65) Prior Publication Data

US 2024/0355908 A1 Oct. 24, 2024

Related U.S. Application Data

(63) Continuation of application No. 17/463,365, filed on Aug. 31, 2021, now Pat. No. 12,051,736.

(51) Int. Cl.

*H10D 64/01* (2025.01)
*H10D 30/01* (2025.01)
*H10D 30/67* (2025.01)
*H10D 62/10* (2025.01)
*H10D 64/66* (2025.01)
*H10P 14/20* (2026.01)

(52) U.S. Cl.

CPC ......... *H10D 64/018* (2025.01); *H10D 30/031* (2025.01); *H10D 30/6713* (2025.01); *H10D 30/6735* (2025.01); *H10D 30/6739* (2025.01); *H10D 30/6757* (2025.01); *H10D 62/118* (2025.01); *H10D 64/671* (2025.01); *H10P 14/3452* (2026.01)

(58) Field of Classification Search

CPC ........... H01L 29/66553; H01L 29/0665; H01L 21/0259; H01L 29/42392; H01L 29/4908; H01L 29/4983; H01L 29/66742; H01L 29/78618; H01L 29/78696

See application file for complete search history.

(56) References Cited

U.S. PATENT DOCUMENTS 9,235,267 B2 1/2016 Burrough et al.
9,502,265 B1 11/2016 Jiang et al.

(Continued)

*Primary Examiner* — Nduka E Ojeh
(74) *Attorney, Agent, or Firm* — Seed Intellectual Property Law Group LLP

(57) ABSTRACT

A device includes a substrate, a first nanostructure channel above the substrate and a second nanostructure channel between the first nanostructure channel and the substrate. An inner spacer is between the first nanostructure channel and the second nanostructure channel. A gate structure abuts the first nanostructure channel, the second nanostructure channel and the inner spacer. A liner layer is between the inner spacer and the gate structure.

20 Claims, 26 Drawing Sheets

(56) References Cited

U.S. PATENT DOCUMENTS

| | | | | |
|---|---|---|---|---|
| 9,520,466 | B2 | 12/2016 | Holland et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 9,786,774 | B2 | 10/2017 | Colinge et al. | |
| 9,853,101 | B2 | 12/2017 | Peng et al. | |
| 9,881,993 | B2 | 1/2018 | Ching et al. | |
| 12,051,736 | B2 * | 7/2024 | Chuang | H10D 64/671 |
| 2017/0110554 | A1 * | 4/2017 | Tak | H10D 30/014 |
| 2019/0148515 | A1 * | 5/2019 | Cheng | B82Y 10/00 257/347 |
| 2020/0105929 | A1 * | 4/2020 | Zhang | B82Y 10/00 |
| 2020/0279918 | A1 | 9/2020 | Wu et al. | |
| 2021/0305401 | A1 | 9/2021 | Liaw | |

* cited by examiner

FIELD EFFECT TRANSISTOR WITH INNER SPACER LINER LAYER AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-8 are views of various embodiments of an IC device of at various stages of fabrication according to various aspects of the present disclosure.

DETAILED DESCRIPTION

Figures 1A, 1B:
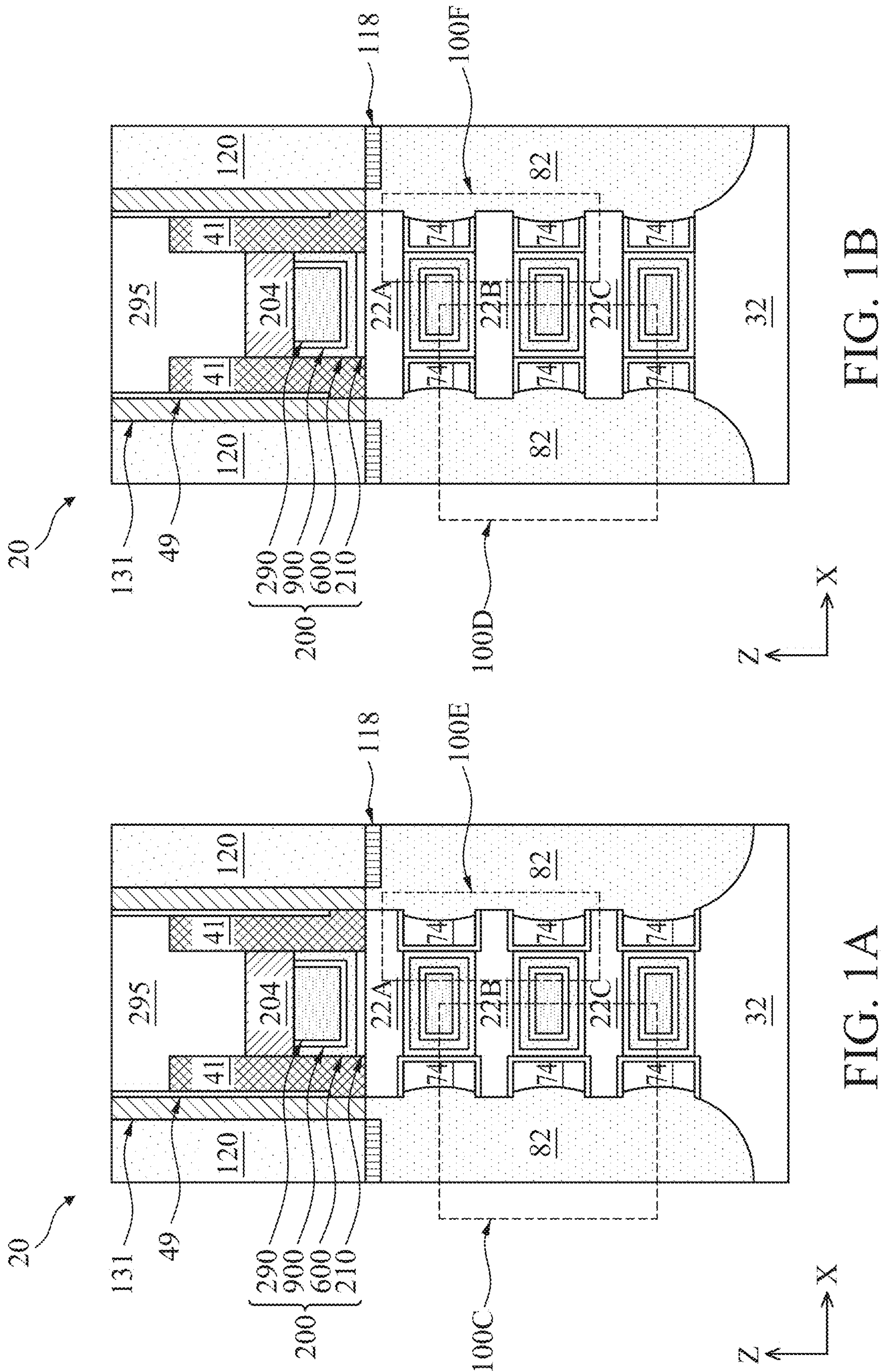
FIGS. 1A-1F are diagrammatic top and cross-sectional side views of a portion of an IC device fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as “about,” “substantially,” and the like, should be interpreted as one having ordinary skill in the art would in view of current technological norms. Generally, the term “substantially” indicates a tighter tolerance than the term “about.” For example, a thickness of “about 100 units” will include a larger range of values, e.g., 70 units to 130 units (+/−30%), than a thickness of “substantially 100 units,” which will include a smaller range of values, e.g., 95 units to 105 units (+/−5%). Again, such tolerances (+/−30%, +/−5%, and the like) may be process- and/or equipment-dependent, and should not be interpreted as more or less limiting than a person having ordinary skill in the art would recognize as normal for the technology under discussion, other than that “about” as a relative term is not as stringent as “substantially” when used in a similar context.

The present disclosure is generally related to semiconductor devices, and more particularly to field-effect transistors (FETs), such as planar FETs, three-dimensional fin-line FETs (FinFETs), or gate-all-around (GAA) devices. In advanced technology nodes, dimension scaling can lead to difficulties forming isolated contacts to features of the semiconductor devices. In many nanosheet processes, undesirable impurities may be driven into and aggregate at interfaces between silicon nanosheets and SiGe during inner spacer formation or post processes, reducing NMOS mobility in nanosheet transistor devices. For example, phosphorous impurities may be present in the inner spacers, or may be introduced during source/drain epitaxial formation. The phosphorous impurities may be driven in from or through the inner spacers in thermal processes, such as epitaxy or anneal processes used when forming the source/drain regions.

Embodiments of the disclosure include a silicon liner, which may be selectively grown on the silicon nanosheets and SiGe surfaces after source/drain region SiGe recessing. The height of silicon nanosheet ends can be optionally recessed on each side. The silicon liner is present between the high-k dielectric layer and/or the interfacial layer and inner spacers following metal gate formation. The silicon liner blocks impurities better than the dielectric material of the inner spacers. As such, presence of the silicon liner can prevent drive-in of undesirable impurities and aggregation thereof at the interface of the silicon nanosheets and SiGe, improving mobility of NMOS devices.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1D:
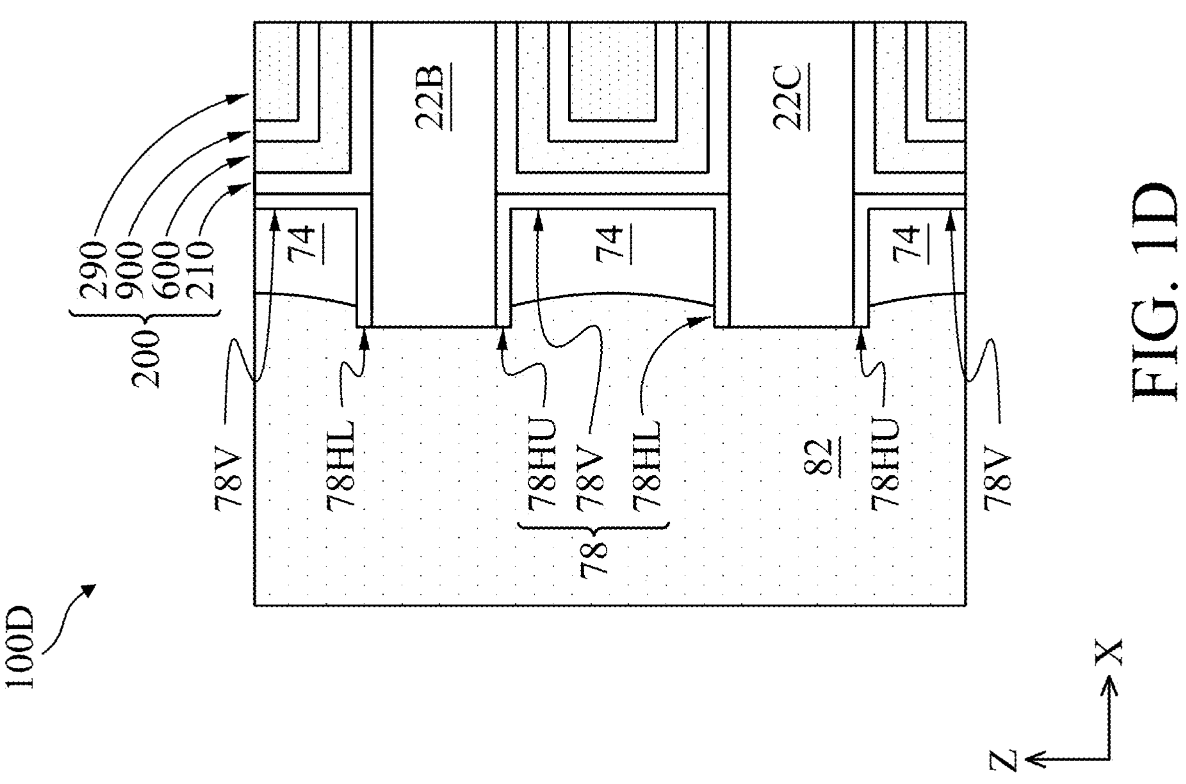
Figure 1C:
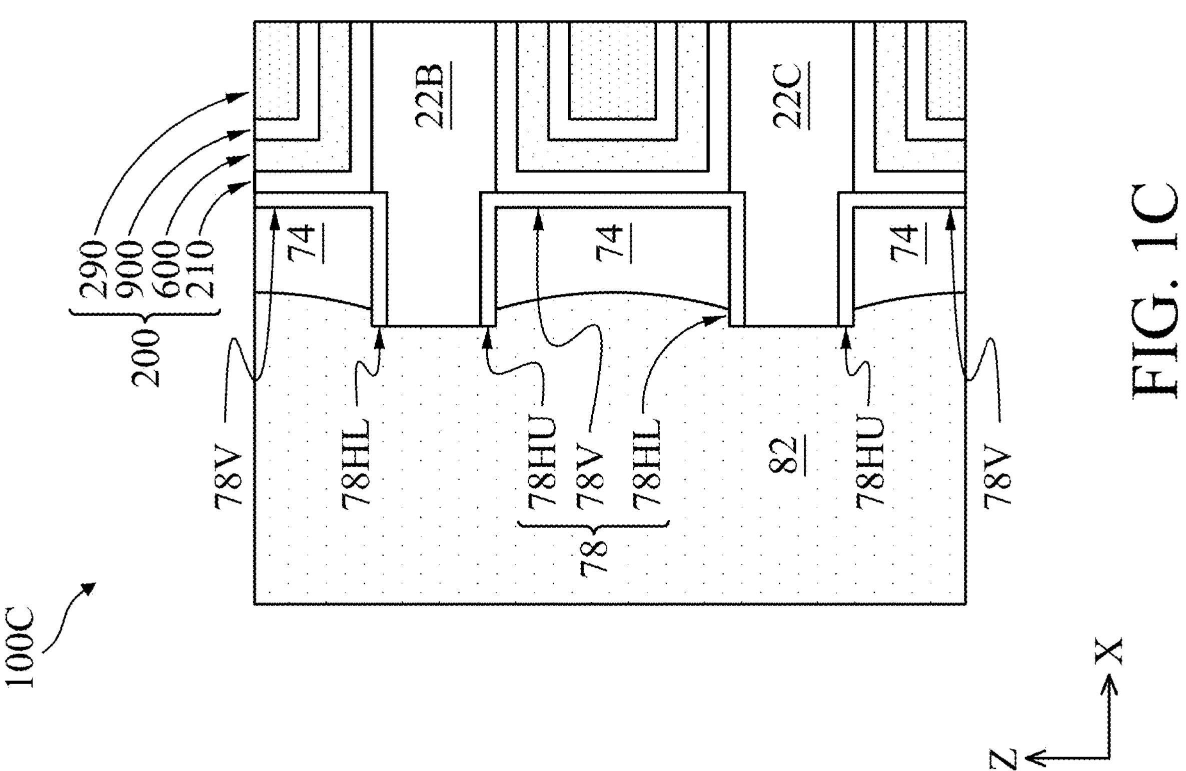
Figure 1F:
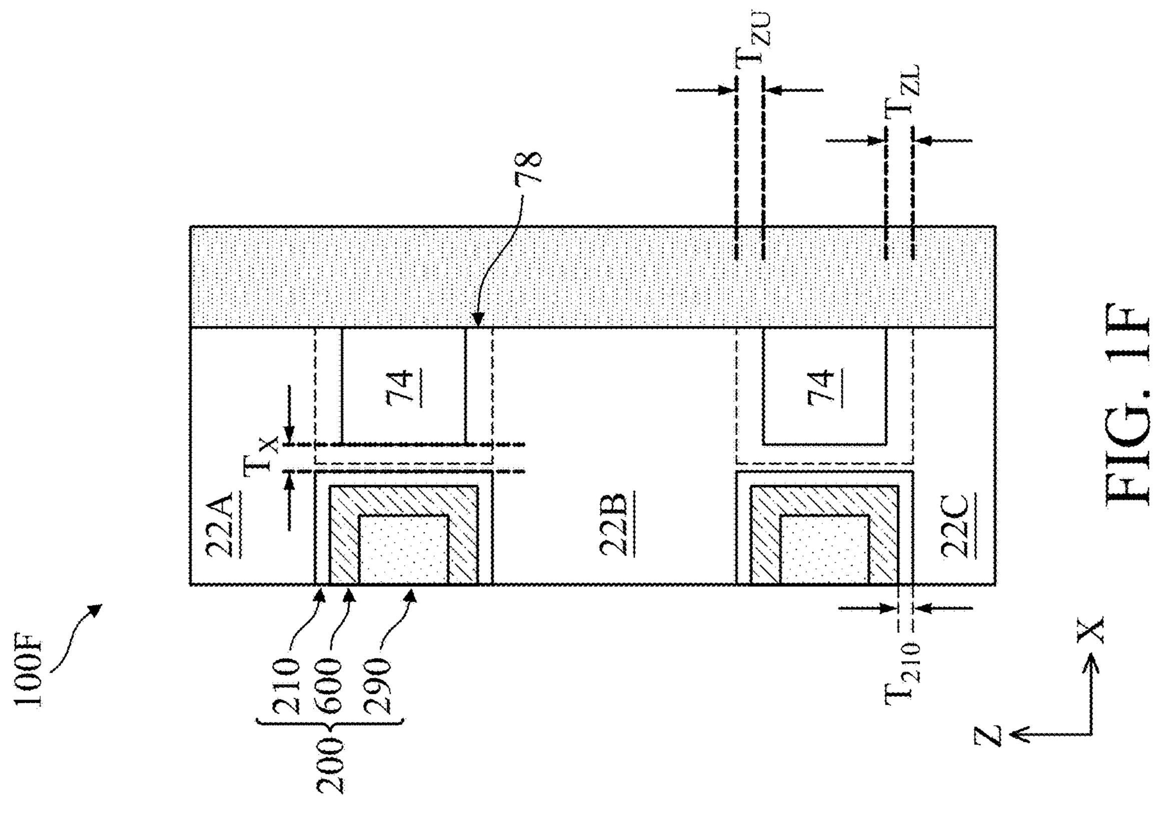
Figure 1E:
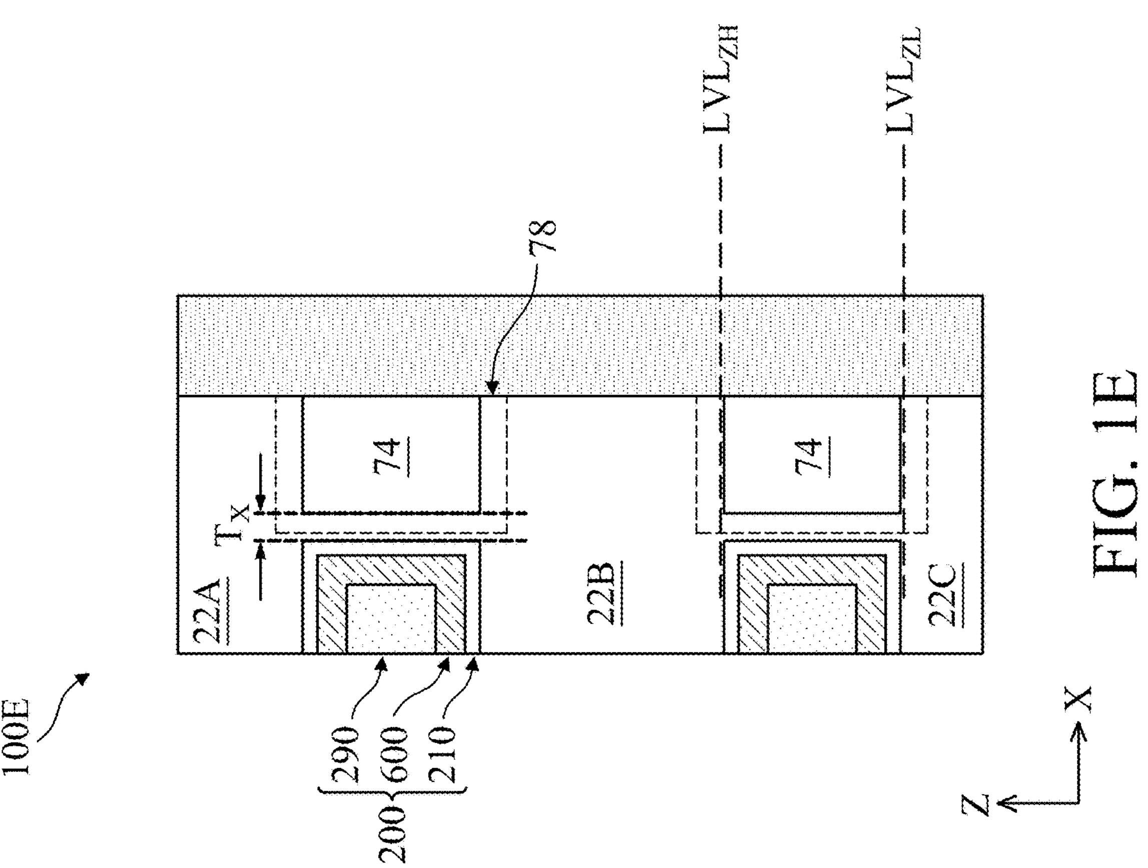

FIGS. 1A-1F illustrate diagrammatic cross-sectional side views of a portion of a gate-all-around (GAA) device 20. FIG. 1A is a diagrammatic side view of a portion of the GAA device 20 in accordance with various embodiments. FIG. 1B is a diagrammatic side view of a portion of the GAA device 20 in accordance with various other embodiments. FIG. 1C is a detailed view of a portion 100C of the GAA device 20 of FIG. 1A. FIG. 1D is a detailed view of a portion 100D of the GAA device 20 of FIG. 1B. FIG. 1E is another detailed view of a portion 100E of the GAA device 20 of FIG. 1A. FIG. 1F is another detailed view of a portion 100F of the GAA device 20 of FIG. 1B.

Referring to FIG. 1A and FIG. 1B, the GAA device 20 may be or include an N-type FET (NFET) or a P-type FET (PFET) in some embodiments. The GAA device 20 is formed over and/or in a substrate 110, and generally includes gate structure 200 straddling and/or wrapping around semiconductor channels 22A-22C, alternately referred to as "nanostructures," located over semiconductor fin 32 protruding from, and separated by, isolation structures 36 (see FIGS. 3A, 3B). The gate structure 200 controls current flow through the channels 22A-22C.

The GAA device 20 is shown including three channels 22A-22C, which are laterally abutted by source/drain features 82, and covered and surrounded by the gate structure 200. Generally, the number of channels 22 is two or more, such as three (FIGS. 1A, 1B) or four or more. The gate structure 200 controls flow of electrical current through the channels 22A-22C to and from the source/drain features 82 based on voltages applied at the gate structure 200 and at the source/drain features 82.

In some embodiments, the fin structure 32 includes silicon. In some embodiments, the GAA device 20 is an NFET, and the source/drain features 82 thereof include silicon phosphorous (SiP). In some embodiments, the GAA device 20 is a PFET, and the source/drain features 82 thereof include silicon germanium (SiGe). Generally, the source/drain features 82 may include any combination of appropriate semiconductor material(s) and appropriate dopant(s).

The channels 22A-22C each include a semiconductive material, for example silicon or a silicon compound, such as silicon germanium, or the like. The channels 22A-22C are nanostructures (e.g., having sizes that are in a range of a few nanometers) and may also each have an elongated shape and extend in the X-direction. In some embodiments, the channels 22A-22C each have a nanowire (NW) shape, a nanosheet (NS) shape, a nanotube (NT) shape, or other suitable nanoscale shape. The cross-sectional profile of the channels 22A-22C may be rectangular, round, square, circular, elliptical, hexagonal, or combinations thereof.

Figure 3B:
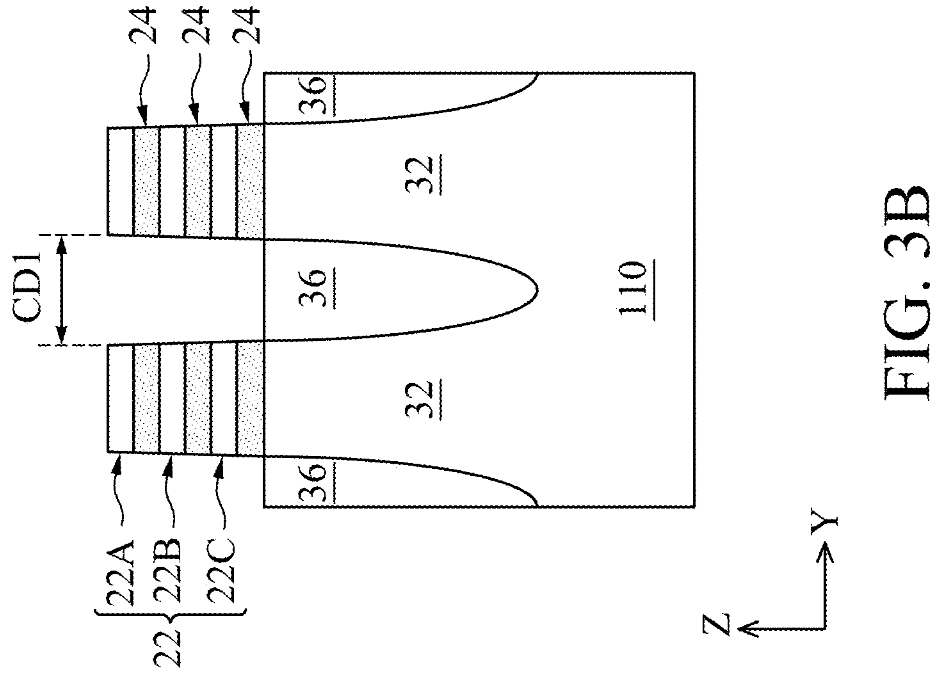
Figure 3A:
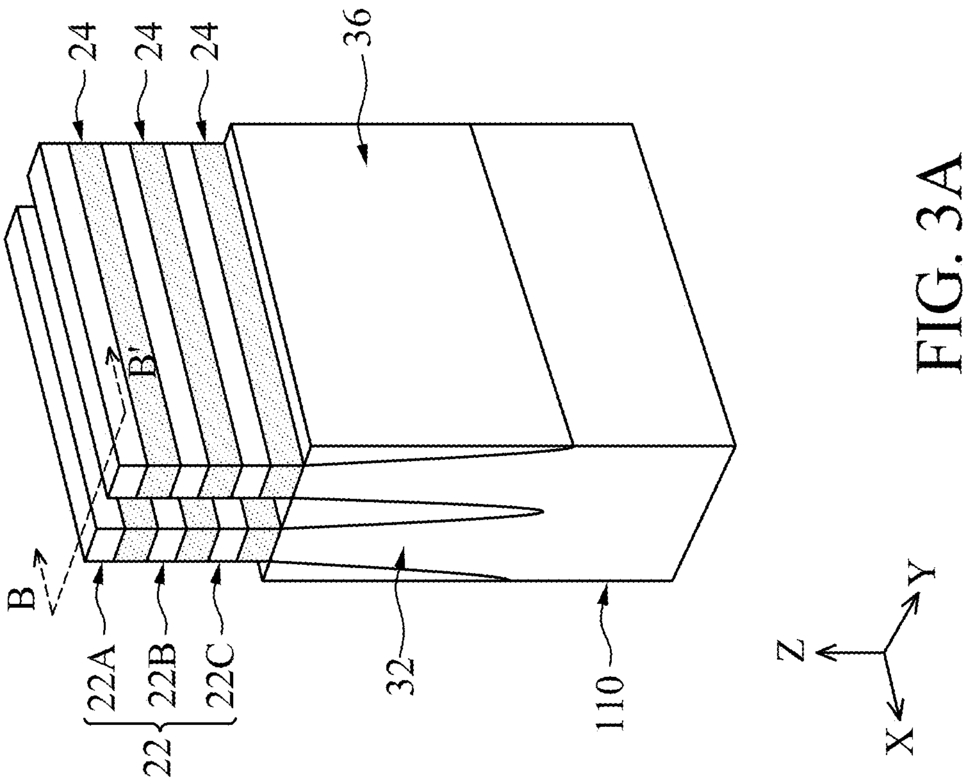

In some embodiments, the lengths (e.g., measured in the X-direction) of the channels 22A-22C may be different from each other, for example due to tapering during a fin etching process (see FIGS. 3A, 3B). In some embodiments, length of the channel 22A may be less than a length of the channel 22B, which may be less than a length of the channel 22C. The channels 22A-22C each may not have uniform thickness (e.g., along the X-axis direction), for example due to a channel trimming process used to expand spacing (e.g., measured in the Z-axis direction) between the channels 22A-22C to increase gate structure fabrication process window. For example, a middle portion of each of the channels 22A-22C may be thinner than the two ends of each of the channels 22A-22C. Such shape may be collectively referred to as a "dog-bone" shape.

In some embodiments, the spacing between the channels 22A-22C (e.g., between the channel 22B and the channel 22A or the channel 22C) is in a range between about 8 nanometers (nm) and about 12 nm. In some embodiments, a thickness (e.g., measured in the Z-direction) of each of the channels 22A-22C is in a range between about 5 nm and about 8 nm. In some embodiments, a width (e.g., measured in the Y-direction, not shown in FIG. 1C, orthogonal to the X-Z plane) of each of the channels 22A-22C is at least about 8 nm.

The gate structure 200 is disposed over and between the channels 22A-22C, respectively. In some embodiments, the gate structure 200 is disposed over and between the channels 22A-22C, which are silicon channels for N-type devices or silicon germanium channels for P-type devices. In some embodiments, the gate structure 200 includes an interfacial layer (IL) 210, one or more gate dielectric layers 600, one or more work function tuning layers 900, and a metal fill layer 290.

The interfacial layer 210, which may be an oxide of the material of the channels 22A-22C, is formed on exposed areas of the channels 22A-22C and the top surface of the fin 32. The interfacial layer 210 promotes adhesion of the gate dielectric layers 600 to the channels 22A-22C. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning. As shown in FIGS. 1C, 1D, the interfacial layer 210 includes vertical portions that are formed on sidewalls of a liner layer 78. The liner layer 78 is described in greater detail with reference to FIGS. 6E, 6F, 7E, 7F.

In some embodiments, the gate dielectric layer 600 includes at least one high-k gate dielectric material, which may refer to dielectric materials having a high dielectric constant that is greater than a dielectric constant of silicon oxide ($k \approx 3.9$). Exemplary high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 600 has thickness of about 5 A to about 100 A.

In some embodiments, the gate dielectric layer 600 may include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

In some embodiments, the gate structure 200 further includes one or more work function metal layers, represented collectively as work function metal layer 900. When configured as an NFET, the work function metal layer 900 of the GAA device 20 may include at least an N-type work function metal layer, an in-situ capping layer, and an oxygen blocking layer. In some embodiments, the N-type work function metal layer is or comprises an N-type metal material, such as TiAlC, TiAl, TaAlC, TaAl, or the like. The in-situ capping layer is formed on the N-type work function metal layer, and may comprise TIN, TiSiN, TaN, or another suitable material. The oxygen blocking layer is formed on the in-situ capping layer to prevent oxygen diffusion into the N-type work function metal layer, which would cause an undesirable shift in the threshold voltage. The oxygen blocking layer may be formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the work function metal layer 900 includes more or fewer layers than those described.

The work function metal layer 900 may further include one or more barrier layers comprising a metal nitride, such as TiN, WN, MoN, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET IO transistor and a PFET IO transistor may have similar threshold voltage in terms of magnitude, but opposite polarity, such as +1 Volt for the NFET IO transistor and −1 Volt for the PFET IO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structure 200 also includes metal fill layer 290. The metal fill layer 290 may include a conductive material such as tungsten, cobalt, ruthenium, iridium, molybdenum, copper, aluminum, or combinations thereof. Between the channels 22A-22C, the metal fill layer 290 is circumferentially surrounded (in the cross-sectional view) by the one or more work function metal layers 900, which are then circumferentially surrounded by the gate dielectric layers 600, which are circumferentially surrounded by the interfacial layer 210. The gate structure 200 may also include a glue layer that is formed between the one or more work function layers 900 and the metal fill layer 290 to increase adhesion. The glue layer is not specifically illustrated in FIGS. 1A-1F for simplicity. In some embodiments, a conductive layer 204 is formed over the gate structure 200, and is in contact with the metal fill layer 290, the one or more work function layers 900 and the gate dielectric layers 600. In some embodiments, a capping layer 295 is present over the conductive layer 204.

The GAA device 20 also includes gate spacers 41 that are disposed on sidewalls of the gate dielectric layer 600 and the IL 210 above the channel 22A, and inner spacers 74 that are separated from sidewalls of the IL 210 by the liner layer 78 between the channels 22A-22C. The inner spacers 74 are also disposed between the channels 22A-22C. The gate spacers 41 and the inner spacers 74 may include a dielectric material, for example a low-k material such as SiOCN, SiON, SiN, or SiOC. In some embodiments, one or more additional spacer layers 49 are present abutting the gate spacers 41, as shown in FIGS. 1A, 1B.

The GAA device 20 may further include source/drain contacts 120 (shown in FIGS. 1A, 1B; collectively referred to as "source drain contacts 120") that are formed over the source/drain features 82. The source/drain contacts 120 may include a conductive material such as tungsten, ruthenium, cobalt, copper, titanium, titanium nitride, tantalum, tantalum nitride, iridium, molybdenum, nickel, aluminum, or combinations thereof. The source/drain contacts 120 may be surrounded by barrier layers (not shown), such as SiN or TiN, which help prevent or reduce diffusion of materials from and into the source/drain contacts 120. A silicide layer 118 may also be formed between the source/drain features 82 and the source/drain contacts 120, so as to reduce the source/drain contact resistance. The silicide layer 118 includes nickel, cobalt, titanium, tantalum, platinum, tungsten, other noble metals, other refractory metals, rare earth metals or their alloys. In some embodiments, thickness of the silicide layer 118 (in the Z direction) is in a range of about 0.5 nm to about 5 nm. In some embodiments, height of the source/drain contacts 120 may be in a range of about 1 nm to about 50 nm.

Figure 6A:
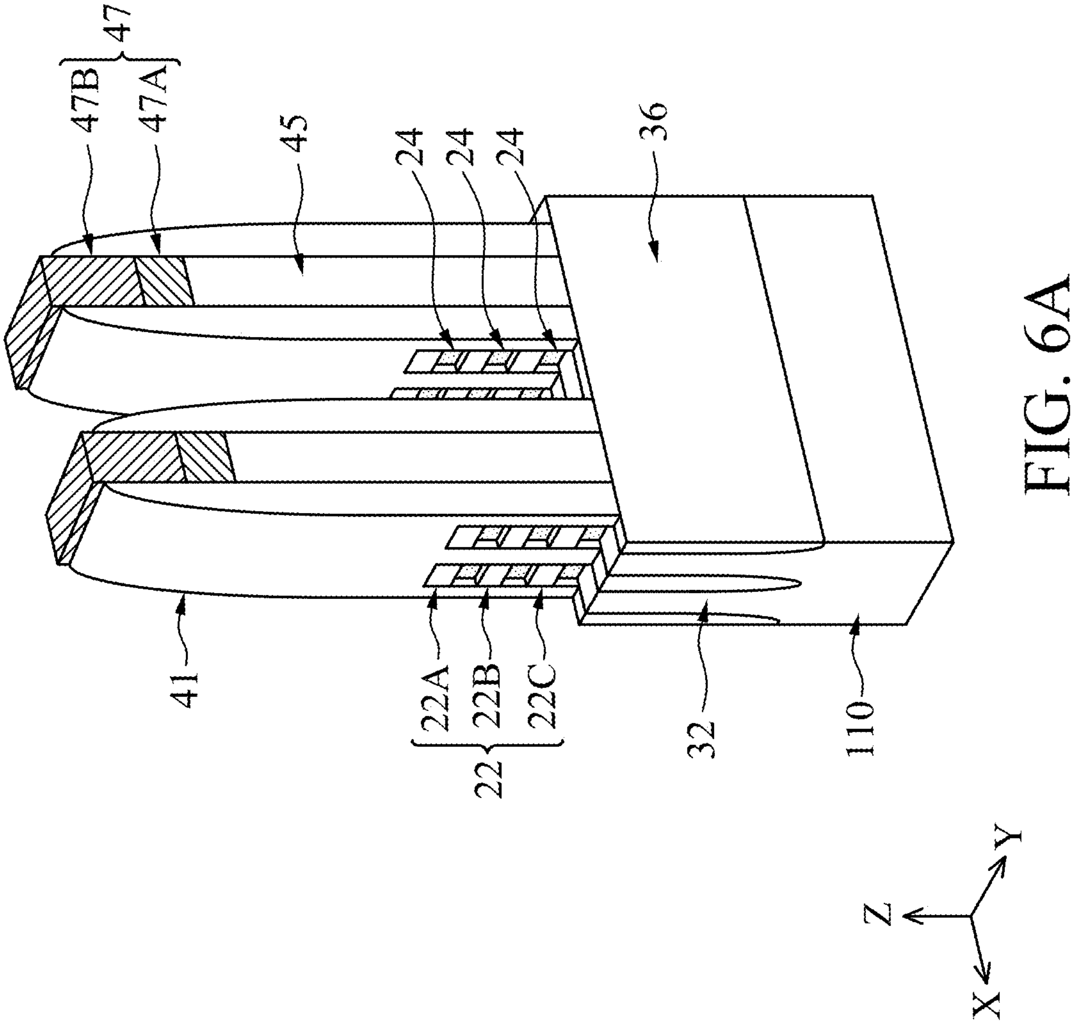
Figure 6C:
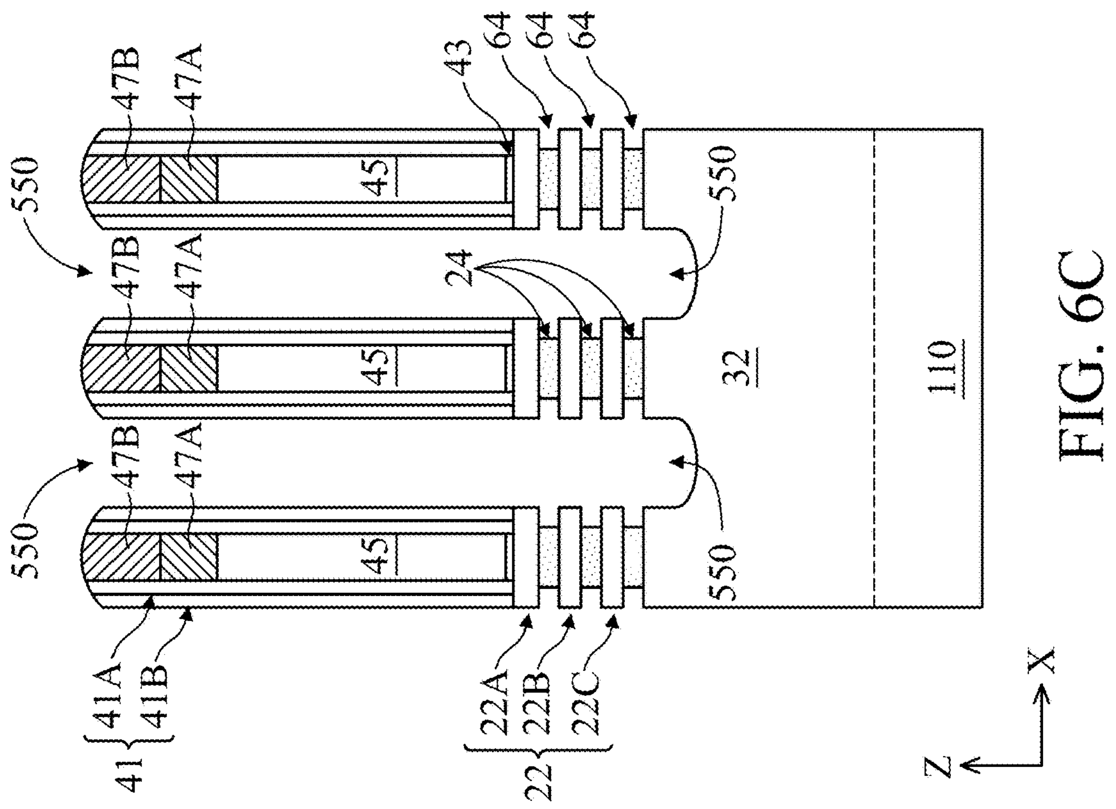
Figure 6B:
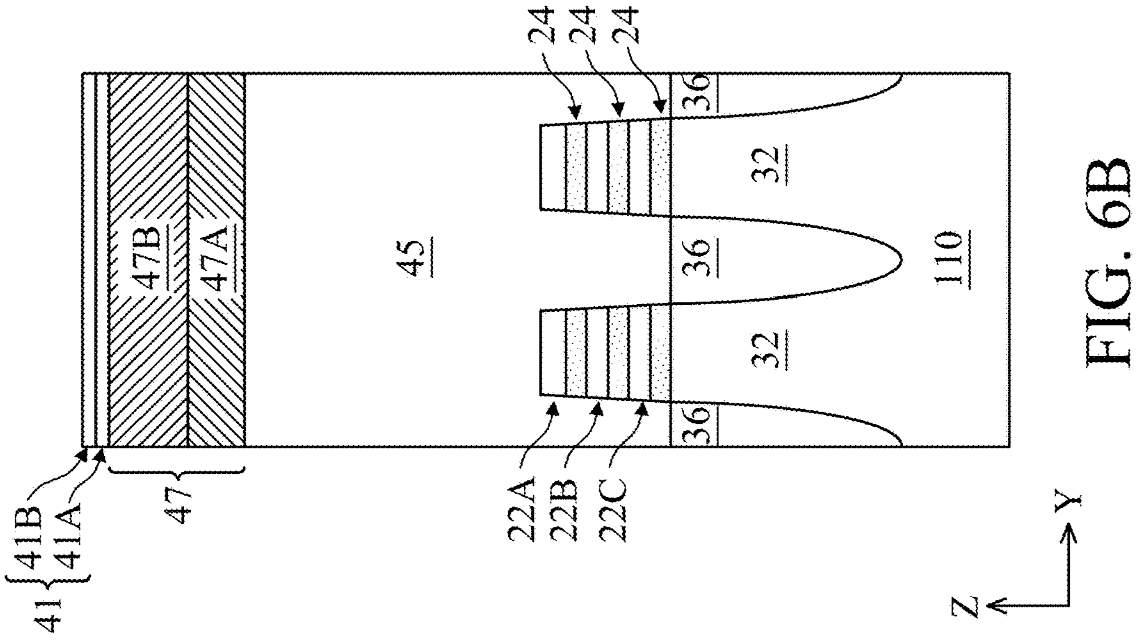
Figure 6E:
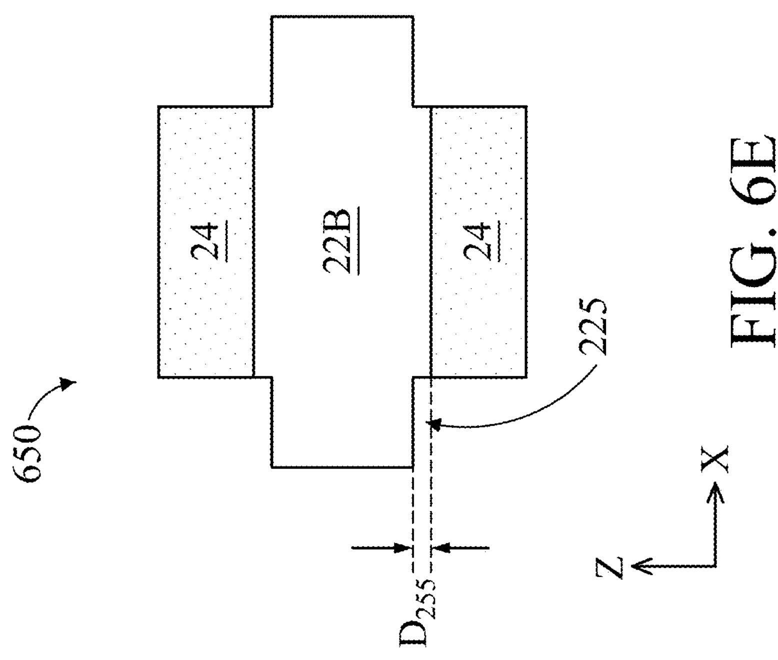
Figure 6D:
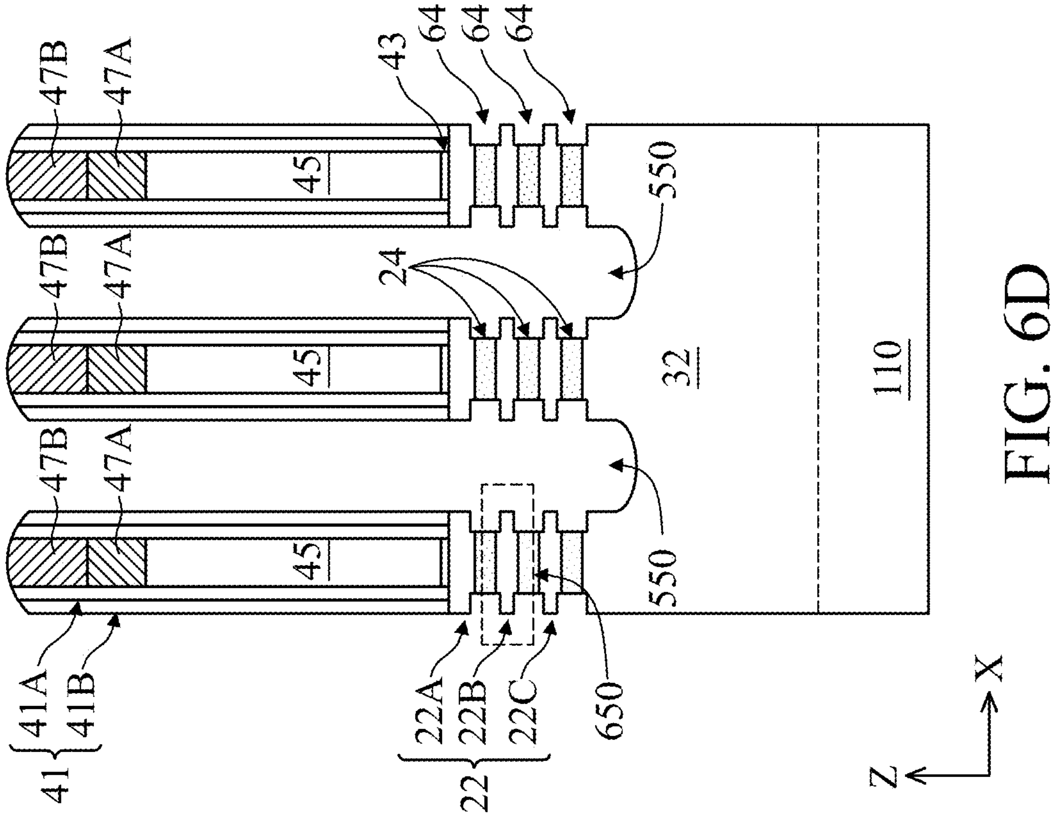
Figure 6G:
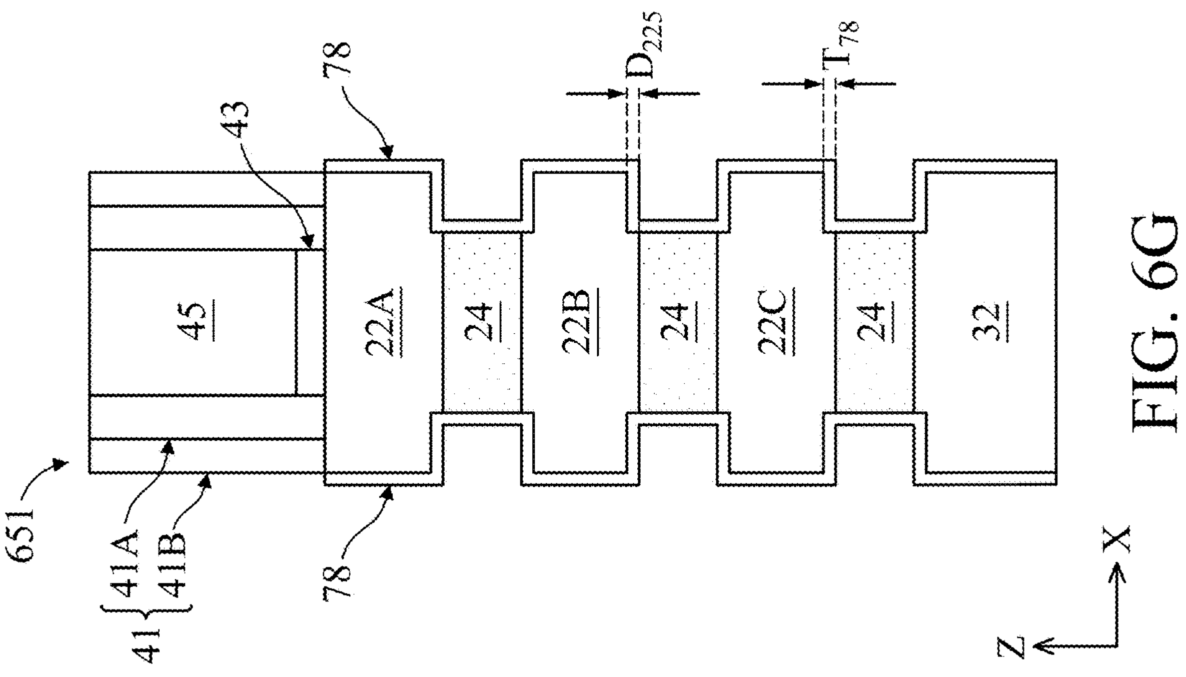
Figure 6F:
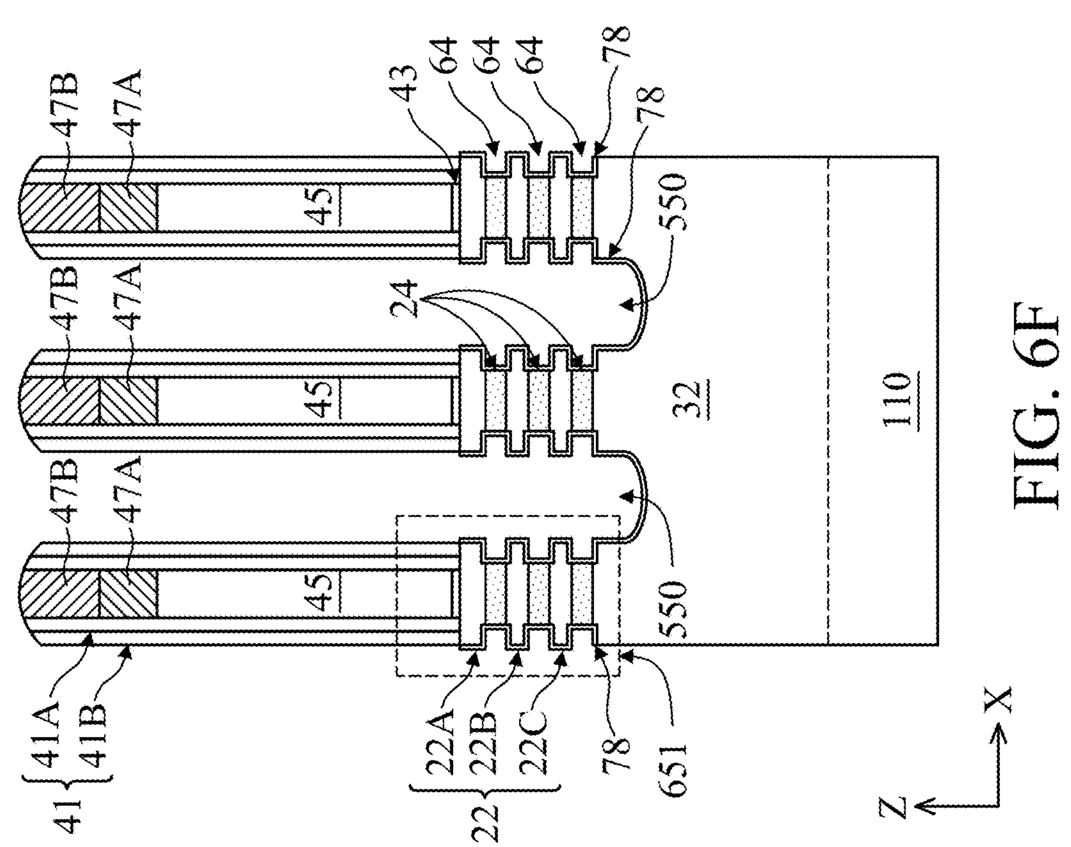
Figure 6H:
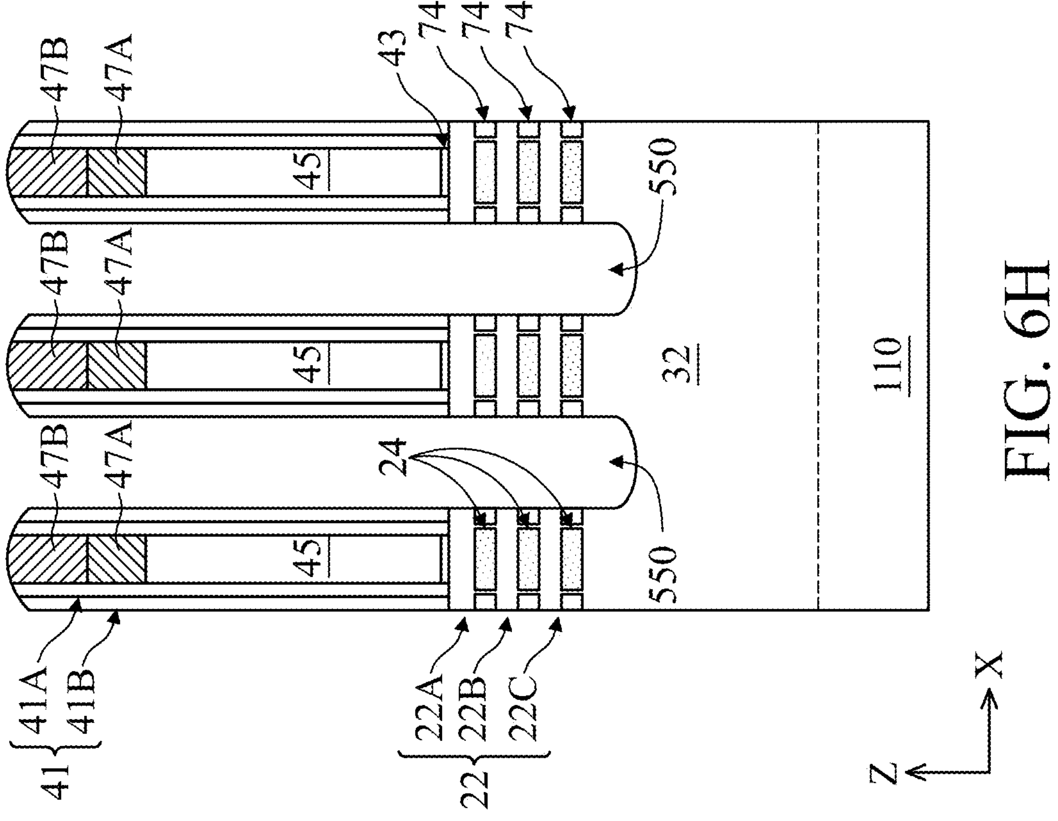
Figure 6J:
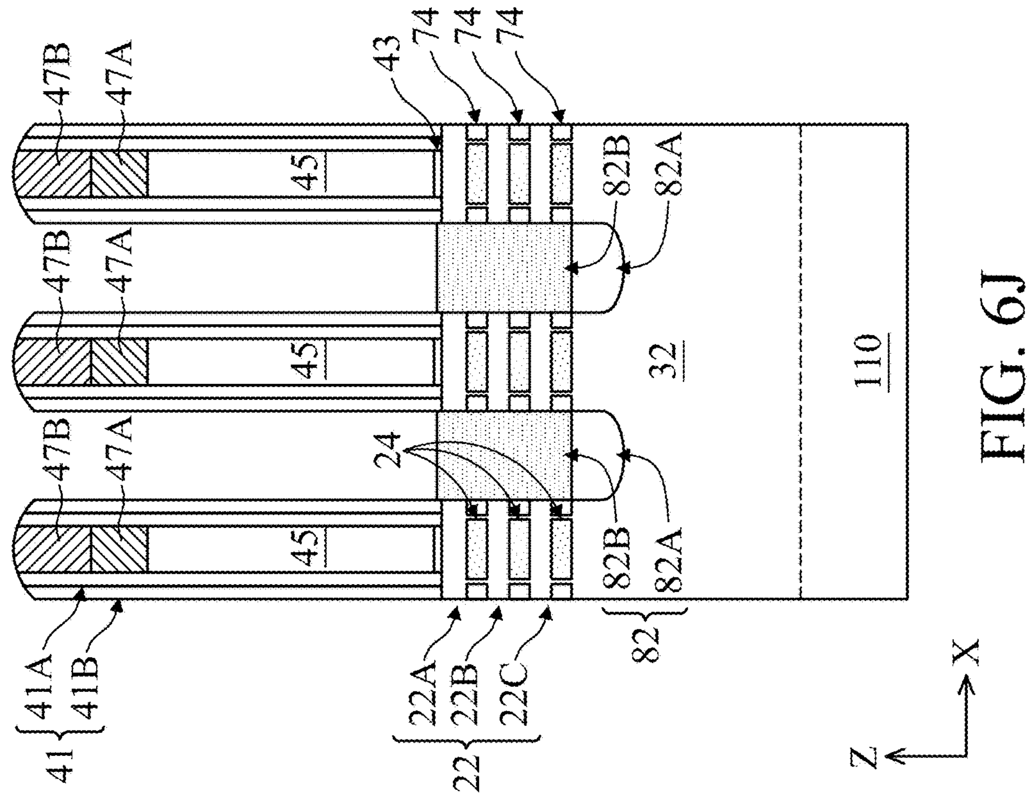
Figure 6I:
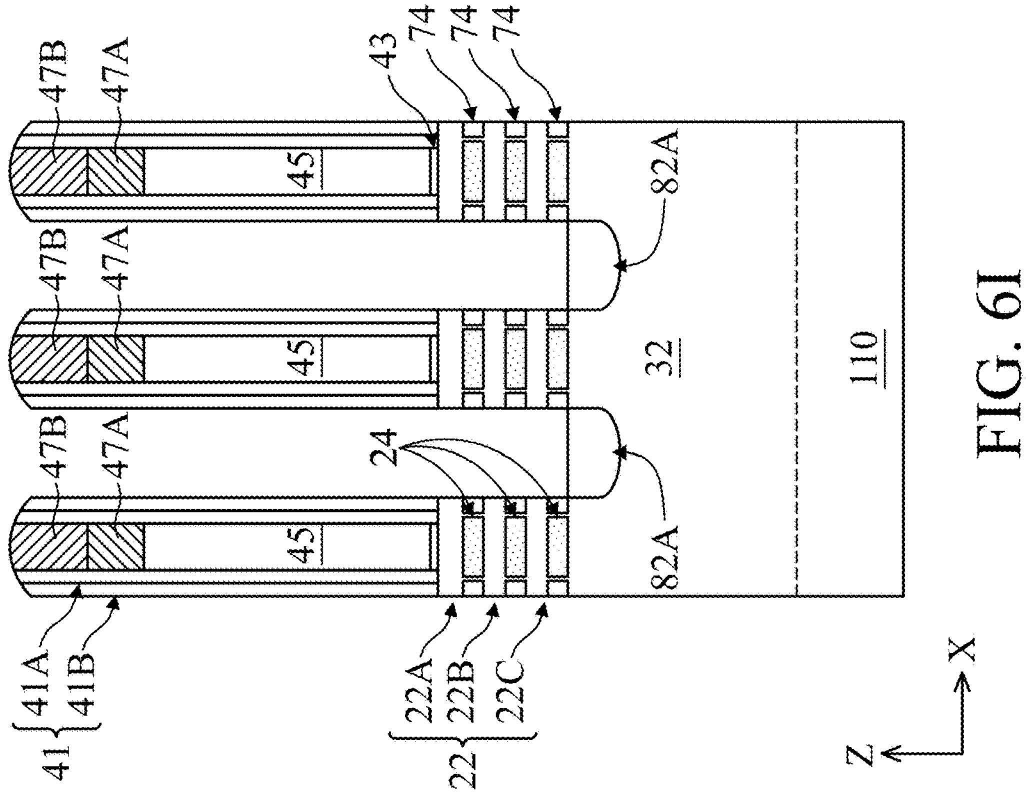
Figure 6L:
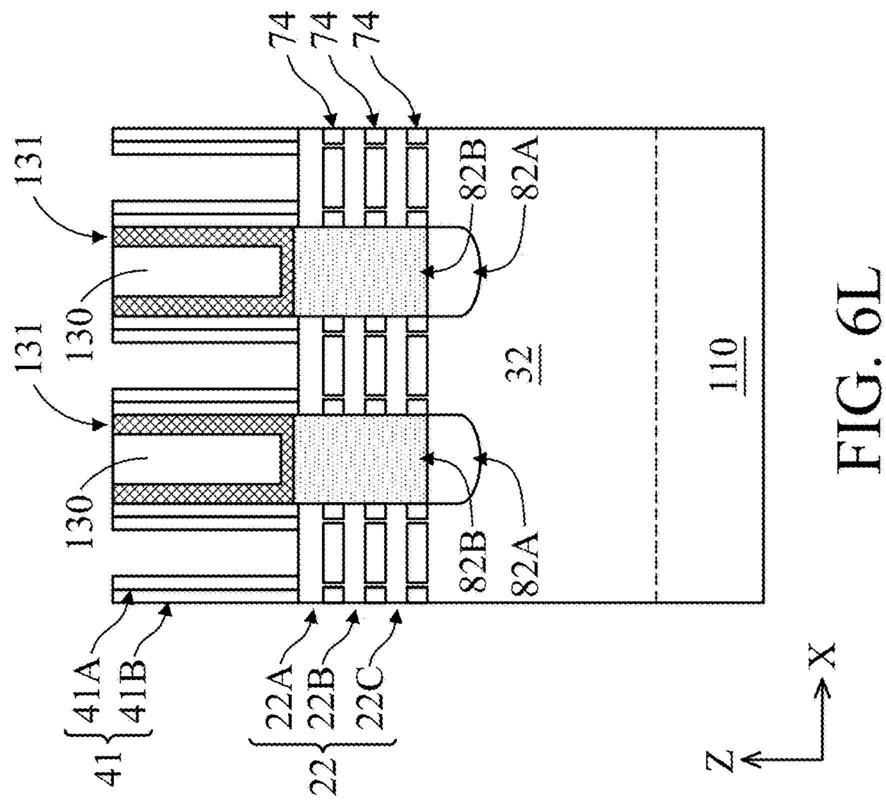
Figure 7B:
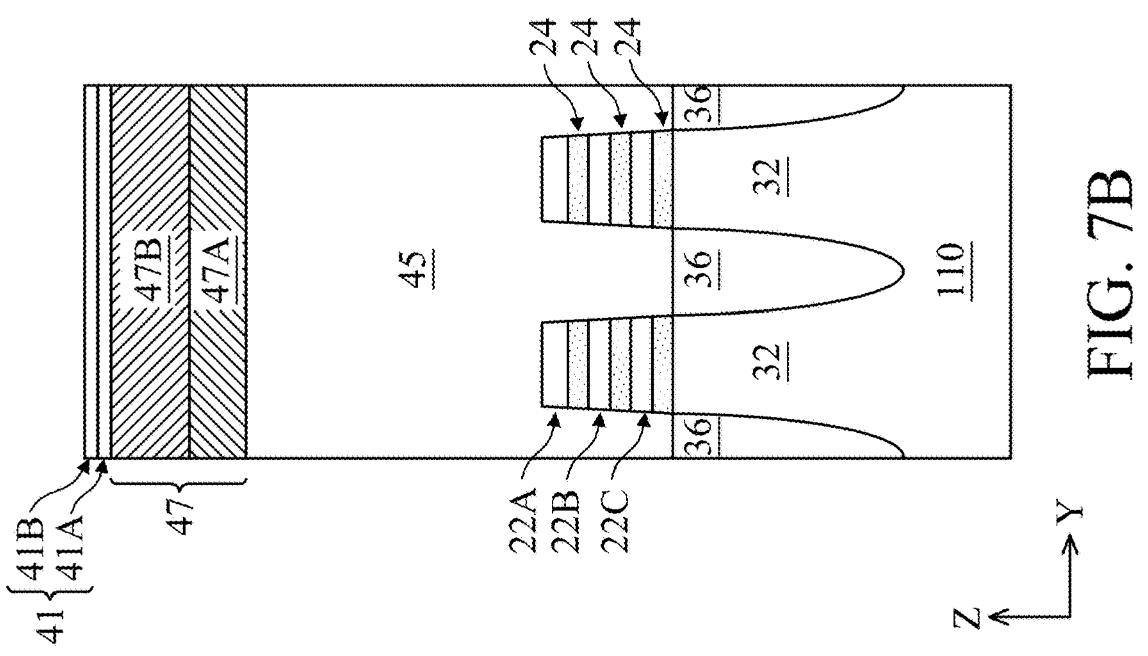
Figure 7A:
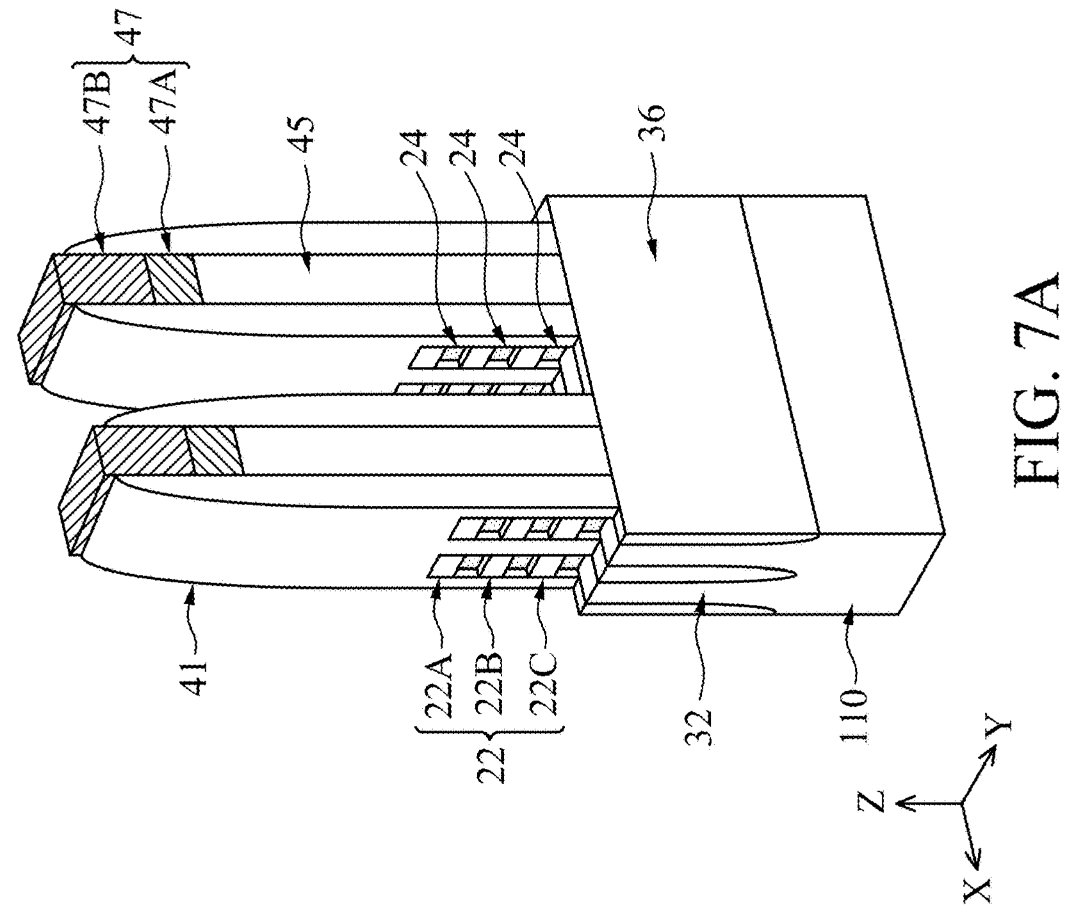
Figure 7D:
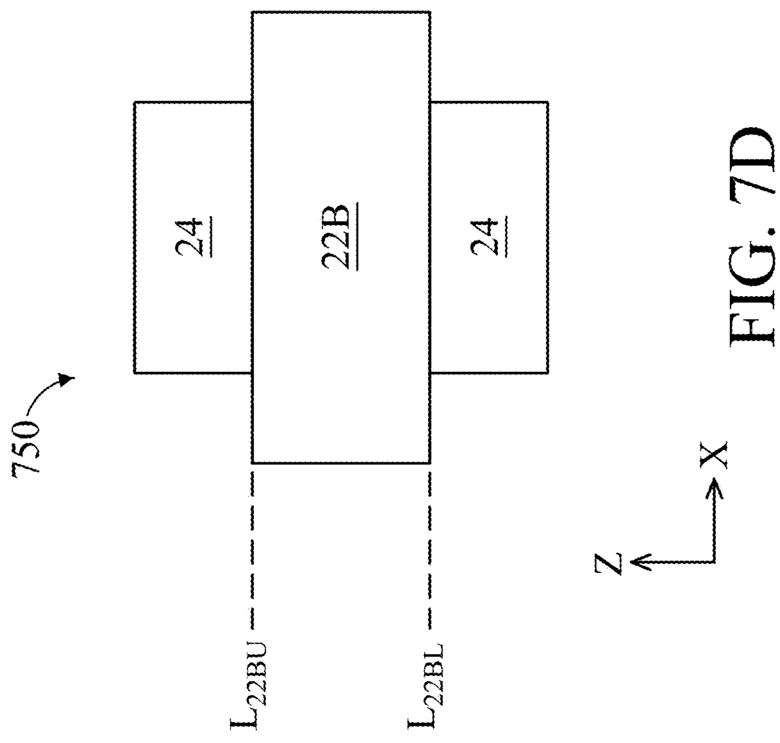
Figure 7C:
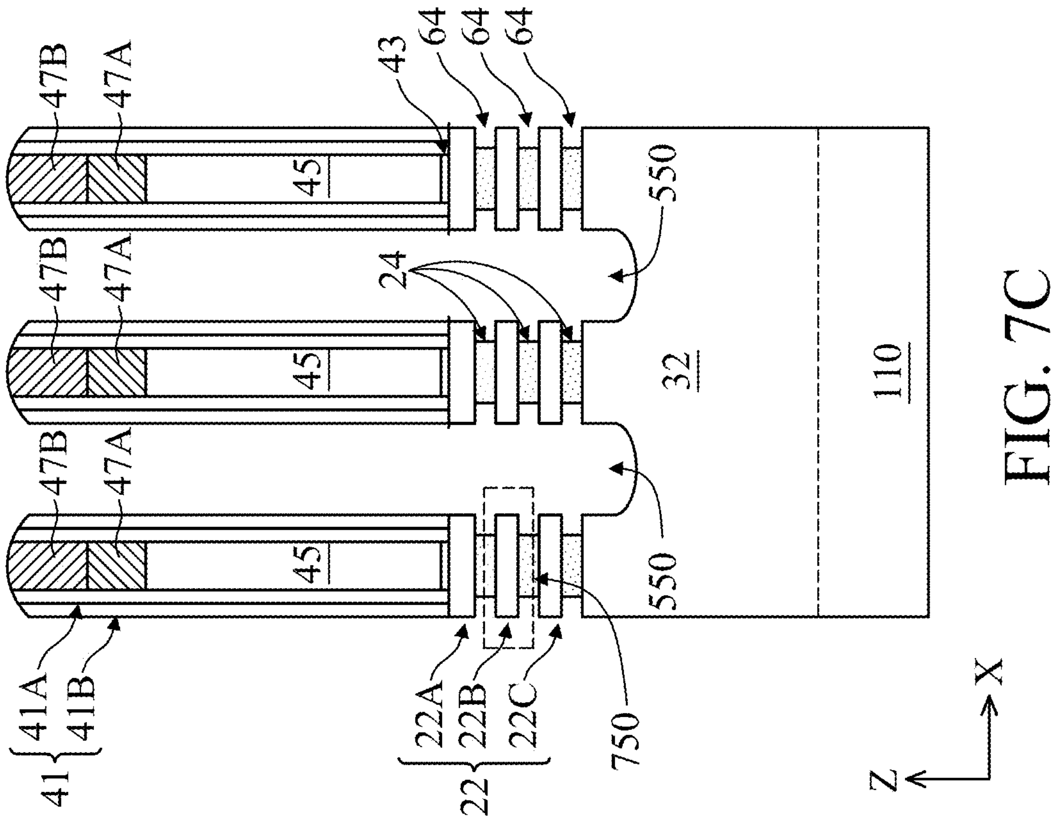
Figure 7F:
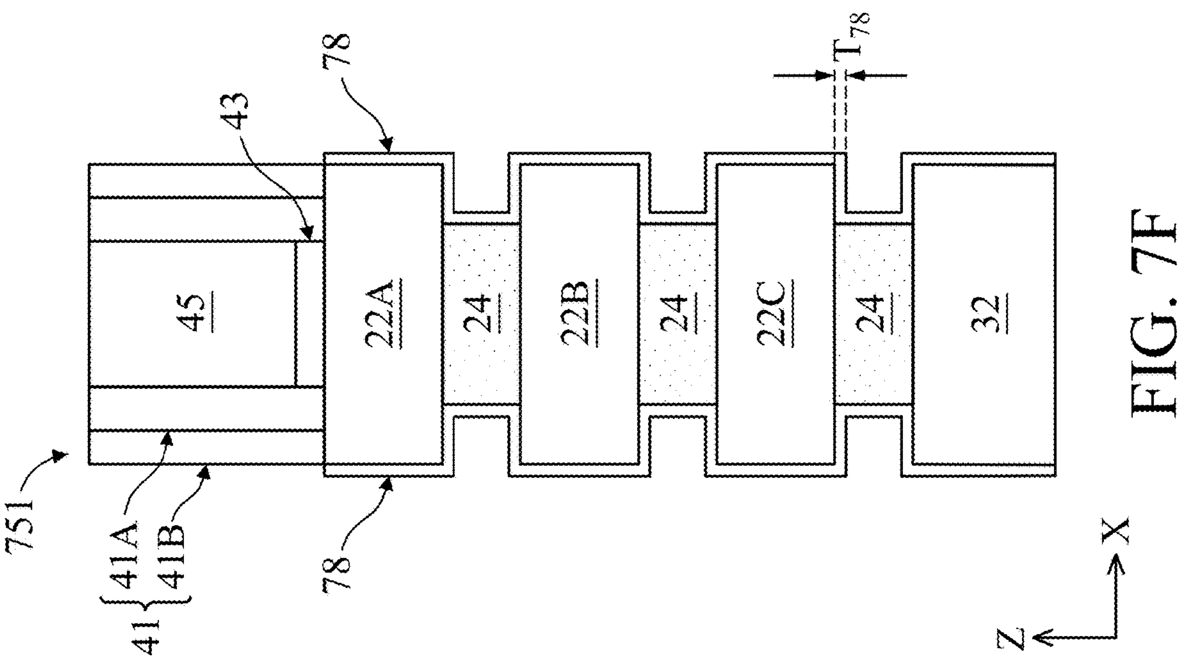
Figure 7E:
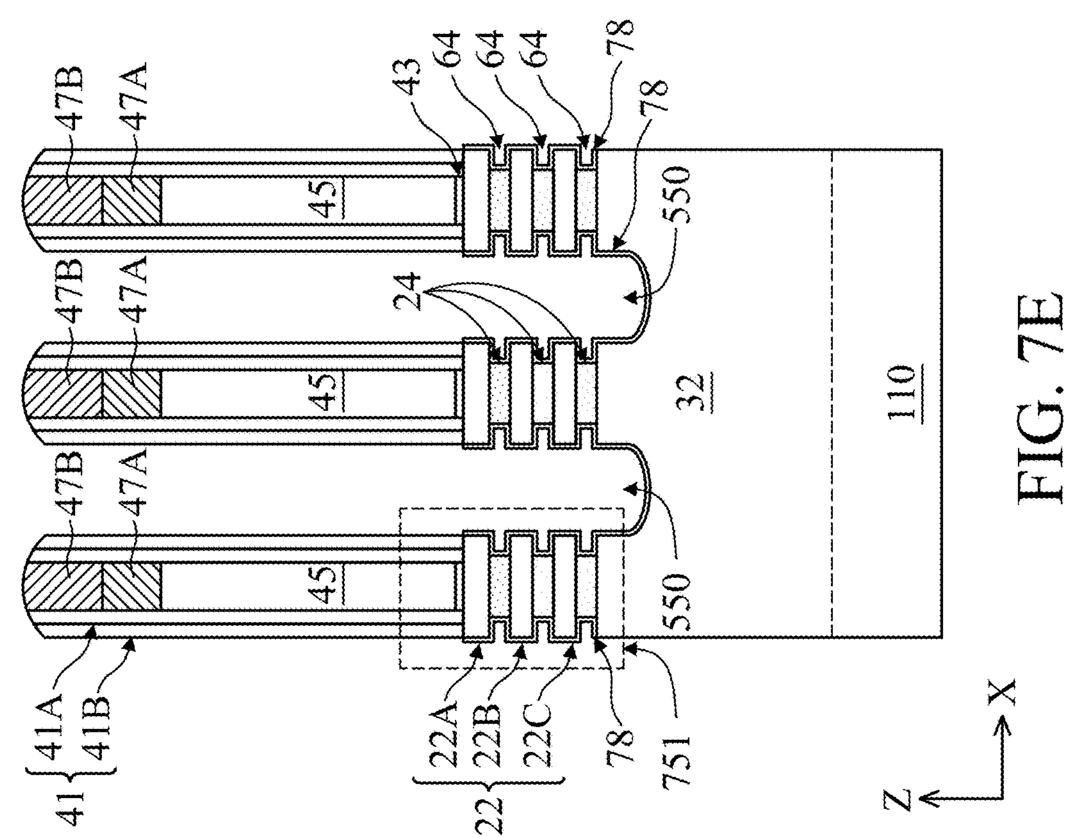
Figure 7H:
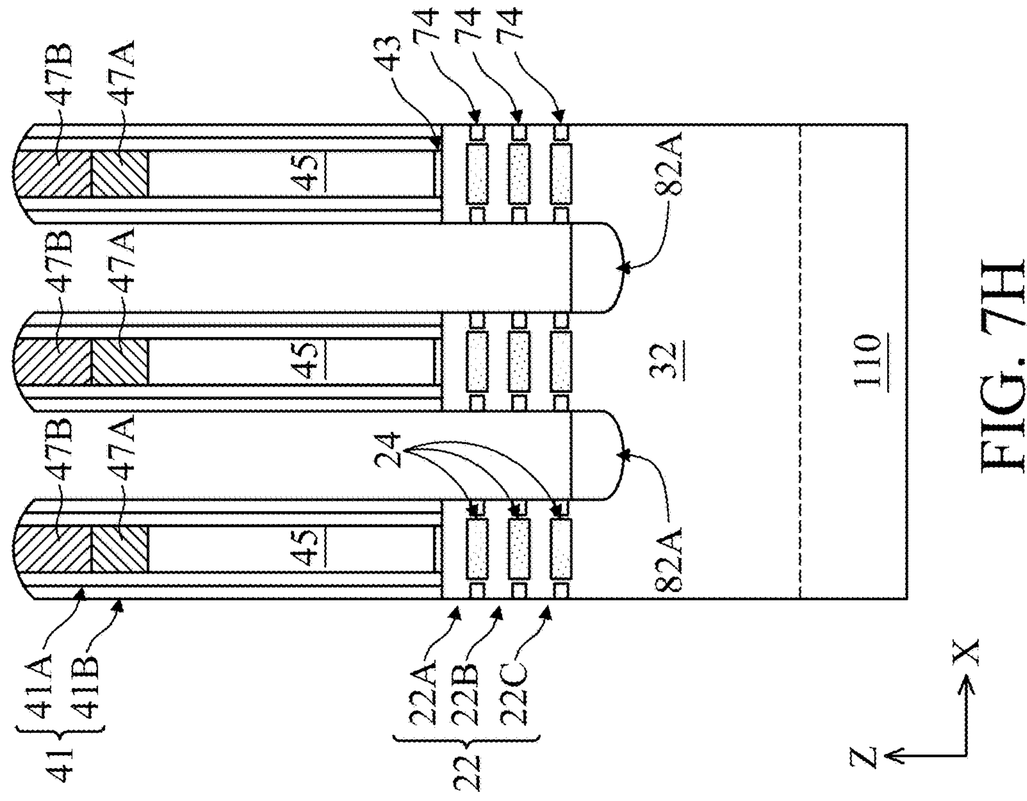
Figure 7G:
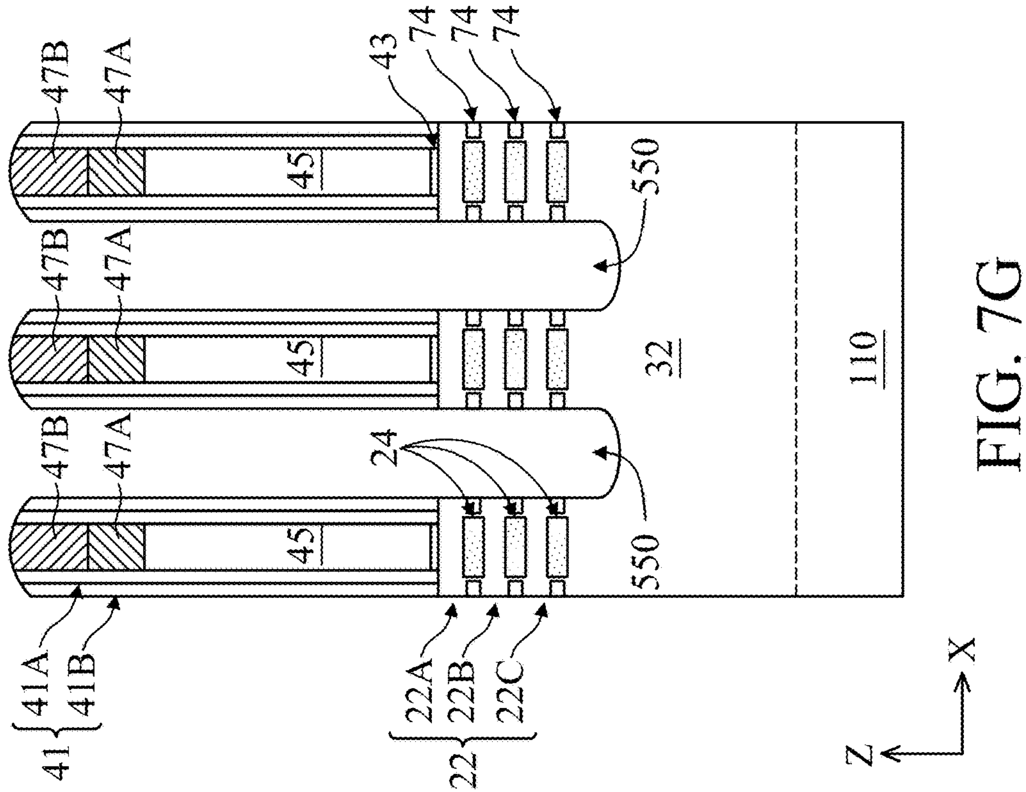
Figure 7J:
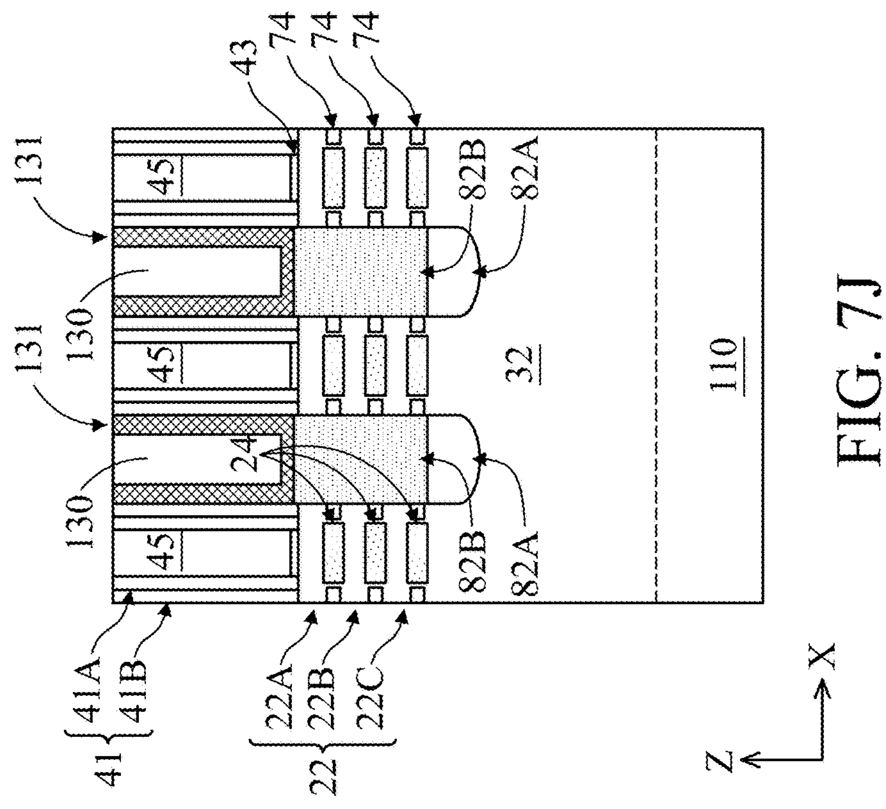
Figure 7I:
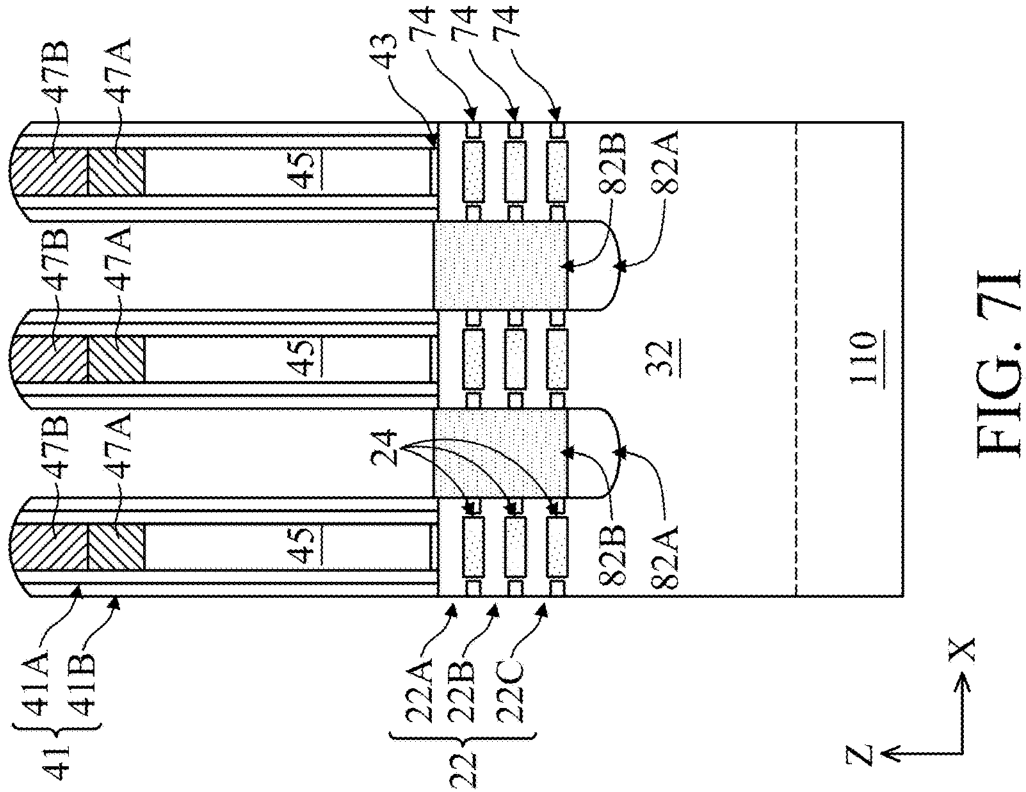
Figure 7K:
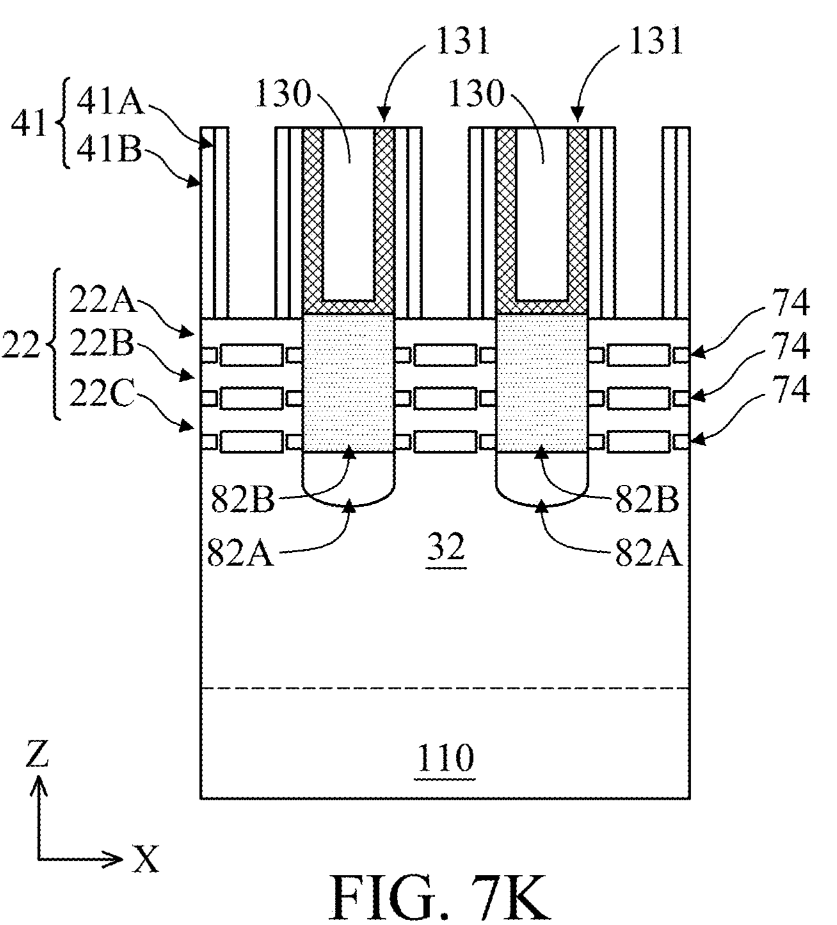
Figure 7L:
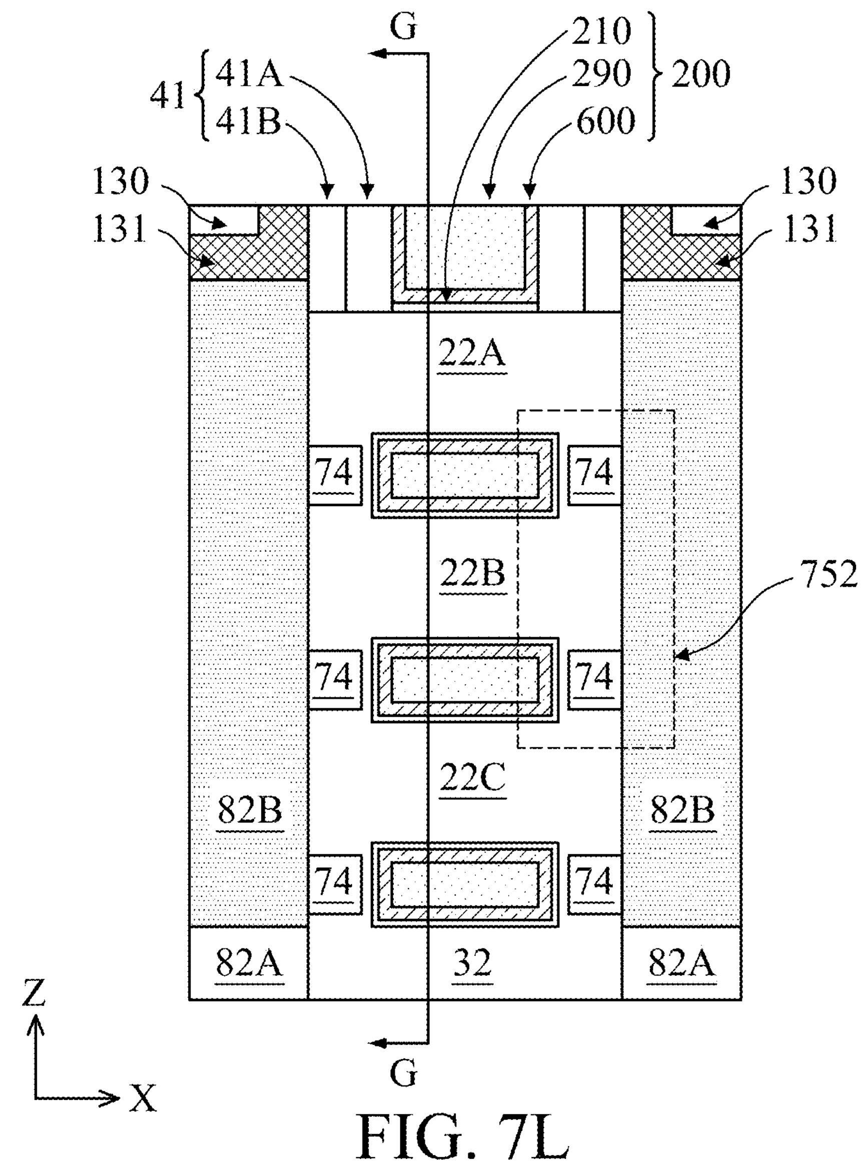

In some embodiments, the GAA device 20 further includes an interlayer dielectric (ILD) 130 (see FIGS. 6L, 7L). The ILD 130 provides electrical isolation between the various components of the GAA device 20 discussed above, for example between the gate structure 200 and the source/drain contact 120 therebetween. An etch stop layer 131 may be formed prior to forming the ILD 130, and may be positioned laterally between the ILD 130 and the gate spacers 41 and vertically between the ILD 130 and the source/drain features 82. In some embodiments, the etch stop layer 131 is or includes SiN, SiCN, SiC, SiOC, SiOCN, HfO2, ZrO2, ZrAlOx, HfAlOx, HfSiOx, Al2O3, or other suitable material. In some embodiments, thickness of the etch stop layer 131 is in a range of about 1 nm to about 5 nm. In some embodiments, where the ILD 130 is not present (e.g., is removed completely prior to formation of the source/drain contact 120), the etch stop layer 131 is in contact with the source/drain contact 120. The etch stop layer 131 may be trimmed, for example, in the X-axis direction prior to formation of the source/drain contact 120 to improve fill quality of the source/drain contact 120.

FIGS. 1C, 1D are detailed views of portions 100C and 100D shown in FIGS. 1A, 1B, respectively. Embodiments of the disclosure describe a liner layer 78, which prevents drive-in of undesirable impurities and aggregation thereof at the interface of the nanosheets 22A-22C and nanostructures 24 (see FIGS. 6E, 6F, 7E, 7F) during formation of the inner spacers 74 or subsequent processes. In some embodiments, the liner layer 78 is or includes substantially the same material as the nanosheet channels 22A-22C. In some embodiments, the liner layer 78 and the nanosheet channels 22A-22C are silicon. In some embodiments, the liner layer 78 has thickness in a range of about 0.5 nm to about 2 nm. Below about 0.5 nm, the liner layer 78 provides insufficient prevention of impurity drive-in and/or aggregation. Above about 2 nm, the liner layer 78 may negatively affect formation of the inner spacers 74 and/or may establish undesirable current paths between neighboring channels 22A-22C (e.g., between the channel 22B and the channel 22C, as shown in FIGS. 1C, 1D).

Many integrated circuits include n-type MOS (NMOS) and p-type MOS (PMOS) transistors. In some embodiments, the liner layer 78 is present in NMOS transistors to enhance mobility of the NMOS transistors, and is not present in PMOS transistors where impurity drive-in may be less of a concern. As such, a device may include a PMOS transistor in which the inner spacer 74 is in contact with the gate structure 200, and an NMOS transistor in which the inner spacer and the gate structure 200 are separated by the liner layer 78. In some embodiments, to simplify processing for example, the liner layer 78 may be formed on the NMOS transistors and the PMOS transistors.

In FIG. 1C, outer portions of the channels 22B, 22C shown are thinner than inner portions of the channels 22B, 22C. In FIG. 1D, the outer portions of the channels 22B, 22C have substantially the same thickness as the inner portions of the channels 22B, 22C. As described, the inner portions may be portions of the channels 22B, 22C in contact with the gate structure 200. The inner portions may have width in the X-axis direction that is substantially the same as width of the interfacial layer 210. The outer portions may correspond to recesses 64 (see FIGS. 6C, 7C) in which the liner layer 78 and the inner spacers 74 are formed. As shown in FIGS. 1C, 1D, the liner layer 78 includes vertical portions 78V extending along the Z-axis direction between the gate structure 200 and the inner spacers 74. The liner layer 78 includes upper horizontal portions 78HU in contact with lower surfaces of the outer portions of the channels 22B, 22C. The liner layer 78 includes lower horizontal portions 78HL in contact with upper surfaces of the channels 22B, 22C. The upper and lower horizontal portions 78HU, 78HL extend along the X-axis direction, which is substantially perpendicular to the Z-axis direction. In some embodiments, the recesses 64 may have a curved (e.g., concave) shape. Generally, the liner layer 78 has shape similar to shape of the recess 64 in which the liner layer 78 is formed. As such, the liner layer 78 may have a curved shape in some embodiments.

FIG. 1E and FIG. 1F illustrate details of levels, gaps and/or thicknesses of the liner layer 78 and the channels 22B, 22C. The liner layer 78 is illustrated in phantom in FIGS. 1E, 1F. In some embodiments, the liner layer 78 is epitaxially grown of substantially the same material as that of the channels 22A-22C, and no visible interface is present between the channels 22A-22C and the liner layer 78. In some embodiments, a visible interface is present between the channels 22A-22C and the liner layer 78.

In FIG. 1E, corresponding to embodiments in which the outer portions of the channels 22A-22C are thinner along the Z-axis direction than the inner portions, the liner layer 78 establishes a gap $T_X$ between the inner spacers 74 and the gate structure 200. In some embodiments, the gap $T_X$ is substantially equal to thickness of the liner layer 78 in the X-axis direction, as shown. The gap $T_X$ may be in a range of about 1 nm to about 2 nm. Thinning the channels 22A-22C prior to forming the liner layer 78 and the inner spacers 74 reduces aspect ratio of the recesses 64 in which the inner spacers 74 are formed, which may improve filling of the inner spacers 74 in the recesses 64. As shown in FIG. 1E, upper and lower surfaces of the inner spacers 74 may be substantially at the same levels $LVL_{ZH}$, $LVL_{ZL}$, respectively, as upper and lower surfaces of the gate structure 200 adjacent to, and separated from, the inner spacers 74. In some embodiments, the upper surfaces of the inner spacers 74 may be at a level slightly above the upper surfaces of the gate structure 200. For example, the thickness of the liner layer 78 may be slightly less than the amount the recess 64 extends into the outer portion of the channel 22B, such that the upper surface of the inner spacer 74 following filling the recess 64 may be at a level slightly above the level $LVL_{ZH}$ shown in FIG. 1E. In some embodiments, the upper surfaces of the inner spacers 74 may be at a level slightly below the upper surfaces of the gate structure 200. For example, the thickness of the liner layer 78 may be slightly greater than the amount the recess 64 extends into the outer portion of the channel 22B, such that the upper surface of the inner spacer 74 following filling the recess 64 may be at a level slightly below the level $LVL_{ZH}$ shown in FIG. 1E.

In FIG. 1F, corresponding to embodiments in which the outer portions of the channels 22A-22C are not trimmed along the Z-axis direction, and are substantially coplanar with the inner portions, the liner layer 78 similarly establishes the gap $T_X$ between the inner spacers 74 and the gate structure 200. As shown in FIG. 1F, upper and lower surfaces of the inner spacers 74 may be substantially offset from upper and lower surfaces of the gate structure 200 along the Z-axis direction by gaps $T_{ZU}$, $T_{ZL}$, respectively. The gaps $T_{ZU}$, $T_{ZL}$ may be substantially equal to the thickness of the liner layer 78. As shown in FIG. 1F, the thickness of the liner layer 78, which may be substantially equal to the gaps $T_{ZU}$, $T_{ZL}$ may be thicker than thickness $T_{210}$ of the interfacial layer 210. In some embodiments, the thickness of the liner layer 78 is thinner than combined thickness of the interfacial layer 210 and the gate dielectric layer 600. The liner layer 78 may be thinner than the gate dielectric layer 600. In some embodiments, the liner layer 78 has substantially the same thickness as the gate dielectric layer 600 or is thicker than the gate dielectric layer 600.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, the disclosures of each which are hereby incorporated by reference in their respective entireties.

Figure 8:
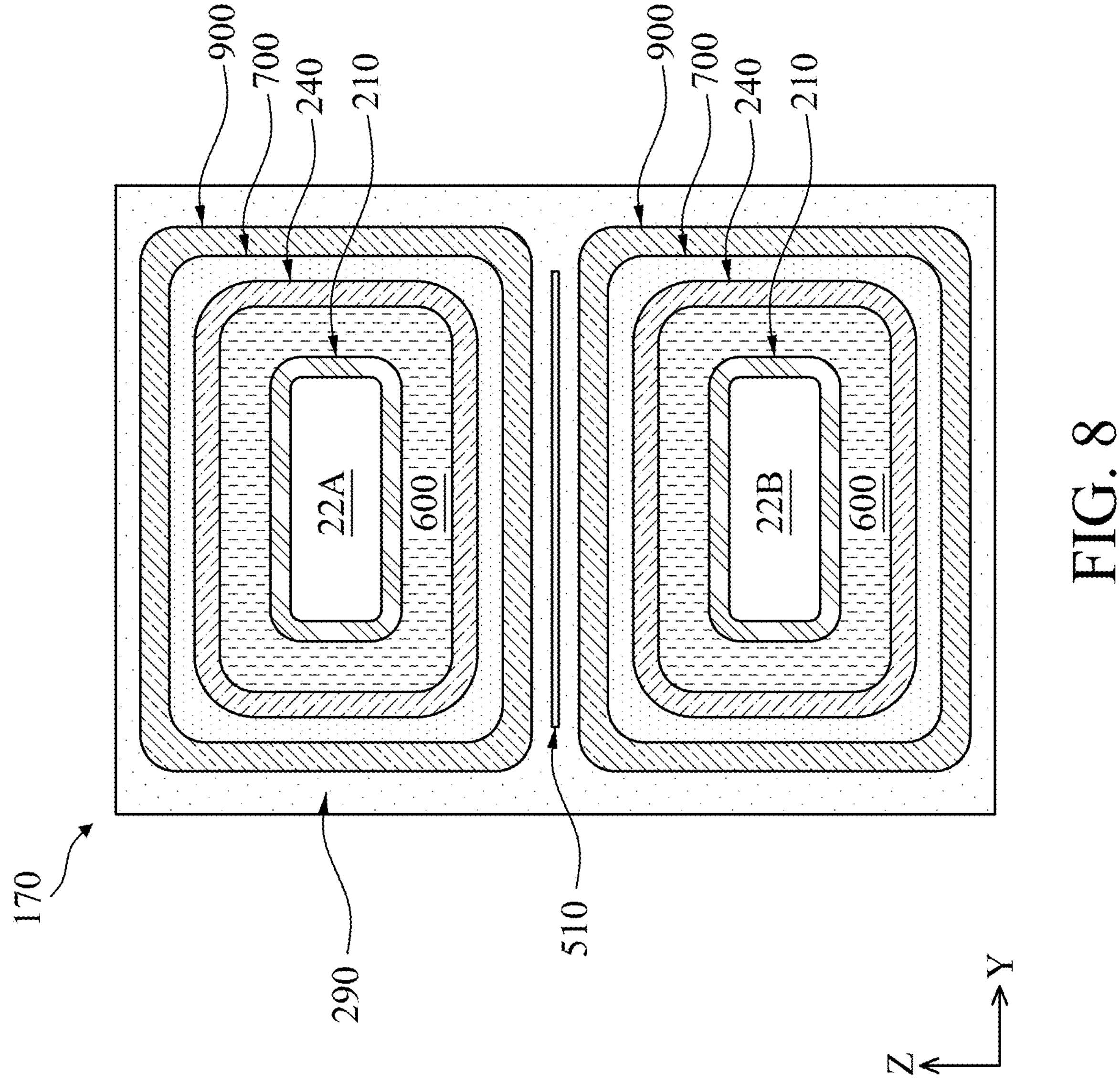
Figure 9:
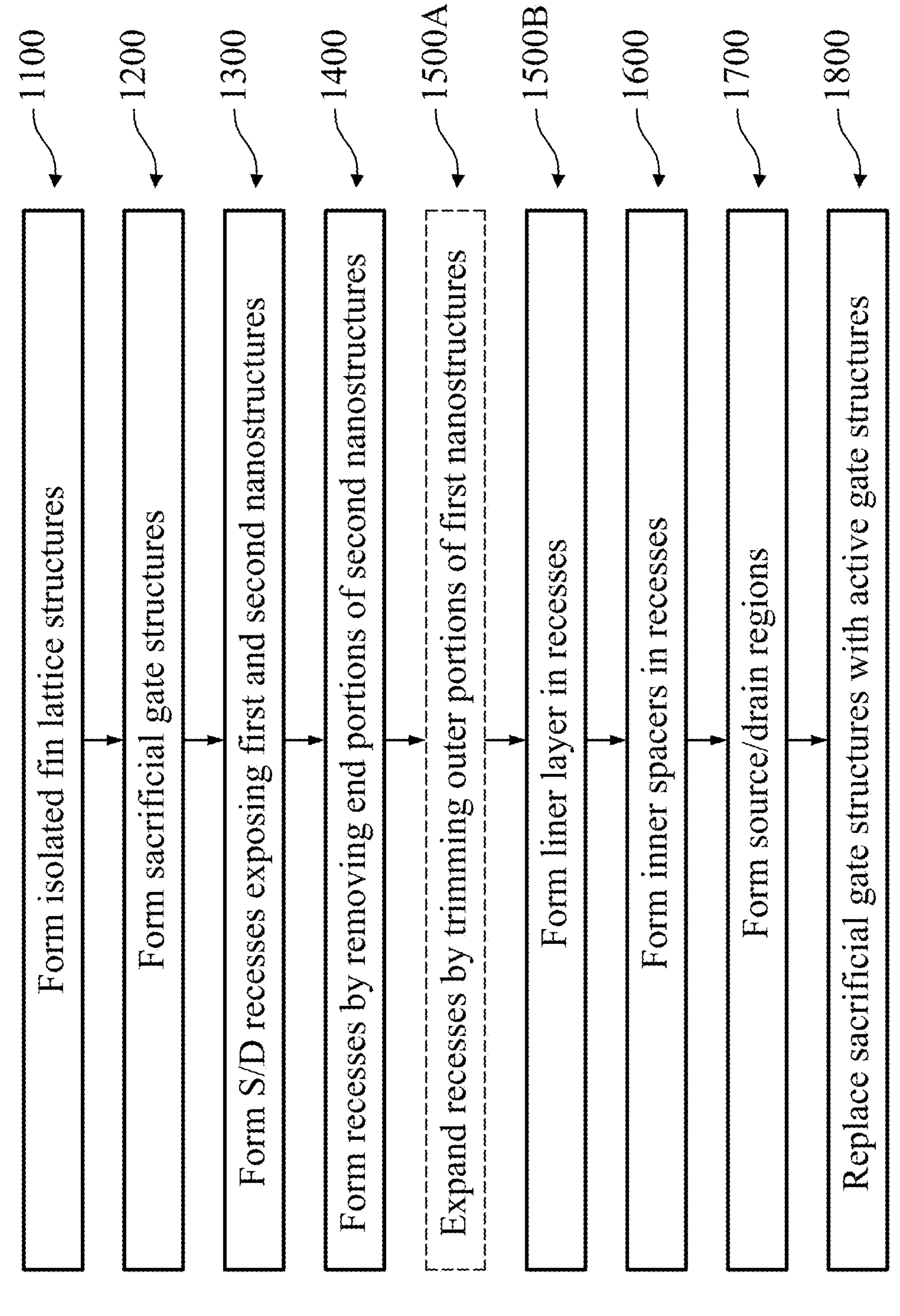
FIG. 9 is a flowchart illustrating methods of fabricating a semiconductor device according to various aspects of the present disclosure.

FIG. 9 illustrates a flowchart of method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000 and some acts described can be replaced, eliminated, or moved around for additional embodiments of the methods. Not all acts are described herein in detail for reasons of simplicity. Method 1000 is described below in conjunction with fragmentary perspective and/or cross-sectional views of a workpiece, shown in FIGS. 2A-8, at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2A through 8 are perspective views and cross-sectional views of intermediate stages in the manufacturing of FETs, such as nanosheet FETs, in accordance with some embodiments. FIGS. 2A, 3A, 4A, 5A, 6A and 7A illustrate perspective views. FIGS. 2B, 3B, 4B, 5B, 6B and 7B illustrate side views taken along reference cross-section B-B' (gate cut) shown in FIGS. 2A, 3A, 4A. FIGS. 4C, 5C, 6C and 7C illustrate side views taken along reference cross-section C-C' (channel/fin cut) illustrated in FIG. 4A. Further side views taken along reference cross-section C-C' are illustrated in FIGS. 6C-6M and FIGS. 7C-7M.

Figures 2A, 2B:
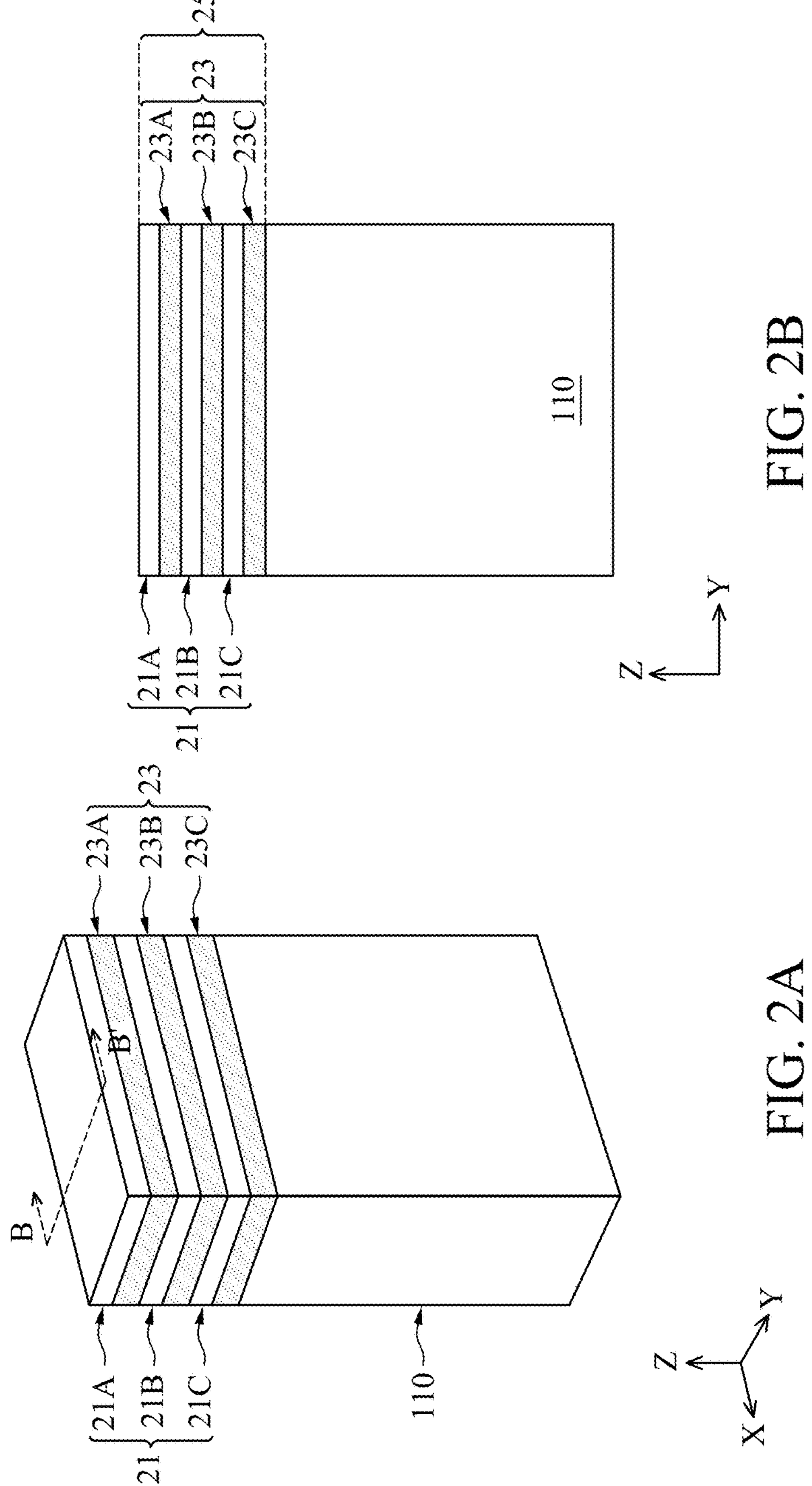

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, a multi-layer stack 25 or "lattice" is formed over the substrate 110 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

In FIG. 3A and FIG. 3B, fins 32 are formed in the substrate 110 and nanostructures 22, 24 are formed in the multi-layer stack 25 corresponding to act 1100 of FIG. 9. In some embodiments, the nanostructures 22, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 22A-22C (also referred to as "channels" below) are formed from the first semiconductor layers 21, and second nanostructures 24A-24C are formed from the second semiconductor layers 23. Distance CD1 between adjacent fins 32 and nanostructures 22, 24 may be from about 18 nm to about 100 nm. A portion of the device 10 is illustrated in FIGS. 3A and 3B including two fins 32 for simplicity of illustration. The process 1000 illustrated in FIGS. 2A-8 may be extended to any number of fins, and is not limited to the two fins 32 shown in FIGS. 3A-8.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIGS. 3A and 3B illustrate the fins 32 having tapered sidewalls, such that a width of each of the fins 32 and/or the nanostructures 22, 24 continuously increases in a direction towards the substrate 110. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIGS. 3A and 3B, isolation regions 36, which may be shallow trench isolation (STI) regions, are formed adjacent the fins 32. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, a fill material, such as those discussed above may be formed over the liner.

The insulation material undergoes a removal process, such as a chemical mechanical polish (CMP), an etch-back process, combinations thereof, or the like, to remove excess insulation material over the nanostructures 22, 24. Top surfaces of the nanostructures 22, 24 may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 2A through 3B illustrate one embodiment (e.g., etch last) of forming the fins 32 and the nanostructures 22, 24. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 3A and FIG. 3B, appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

Figure 4A:
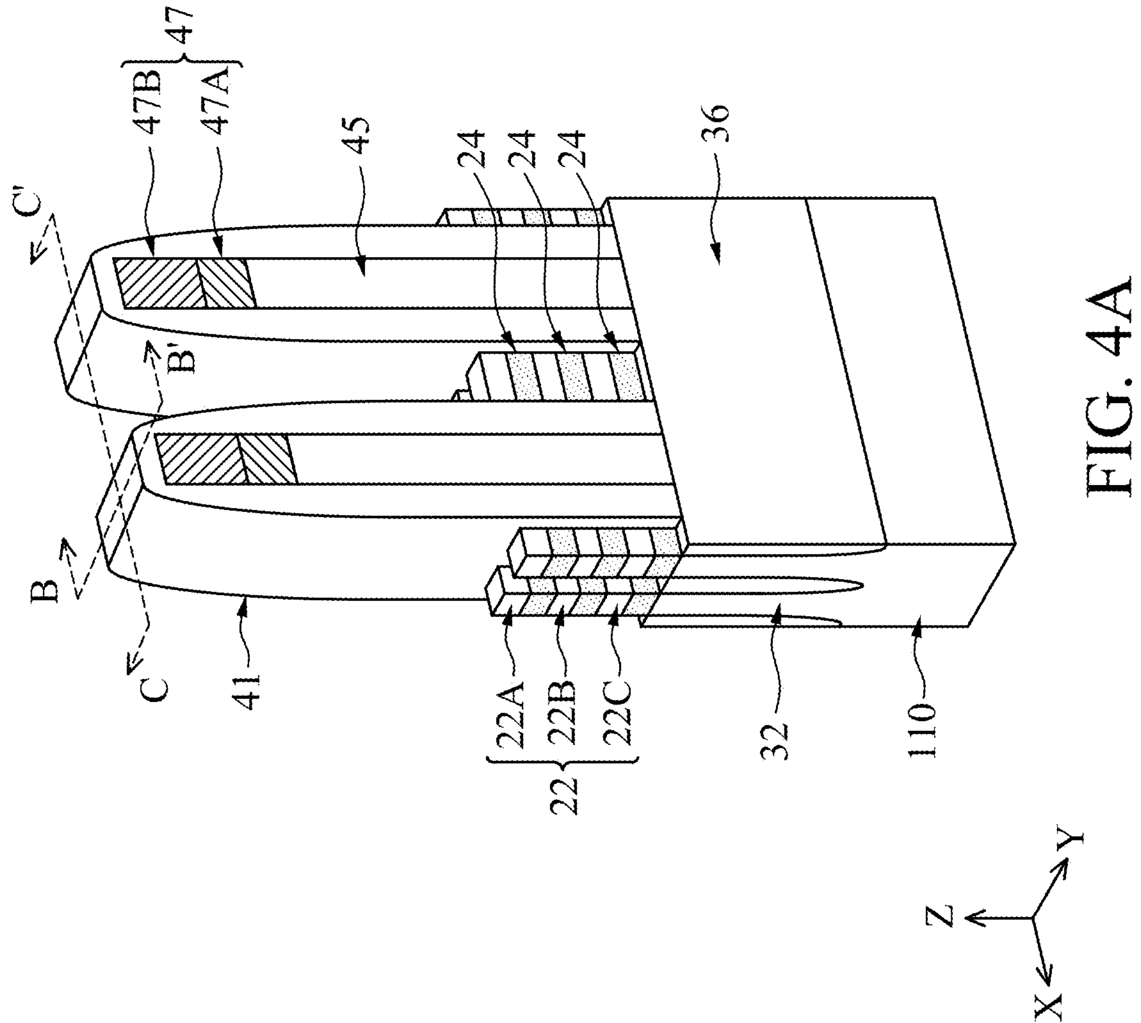
Figure 4C:
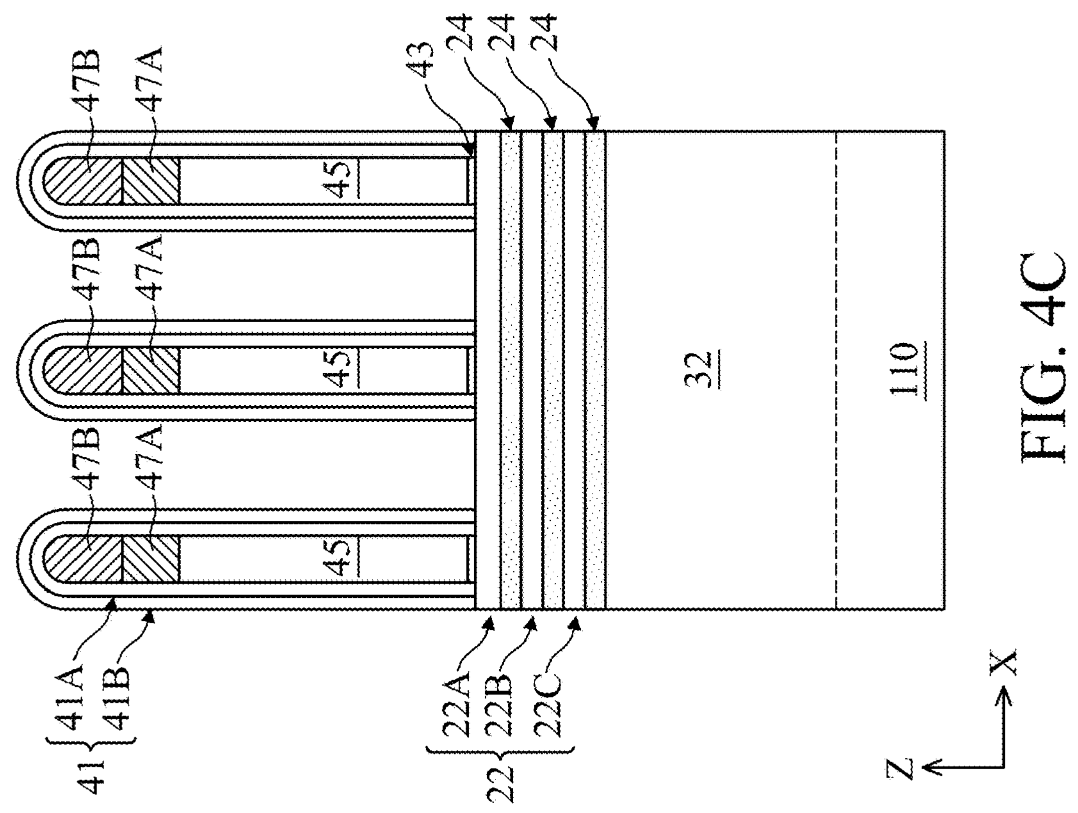
Figure 4B:
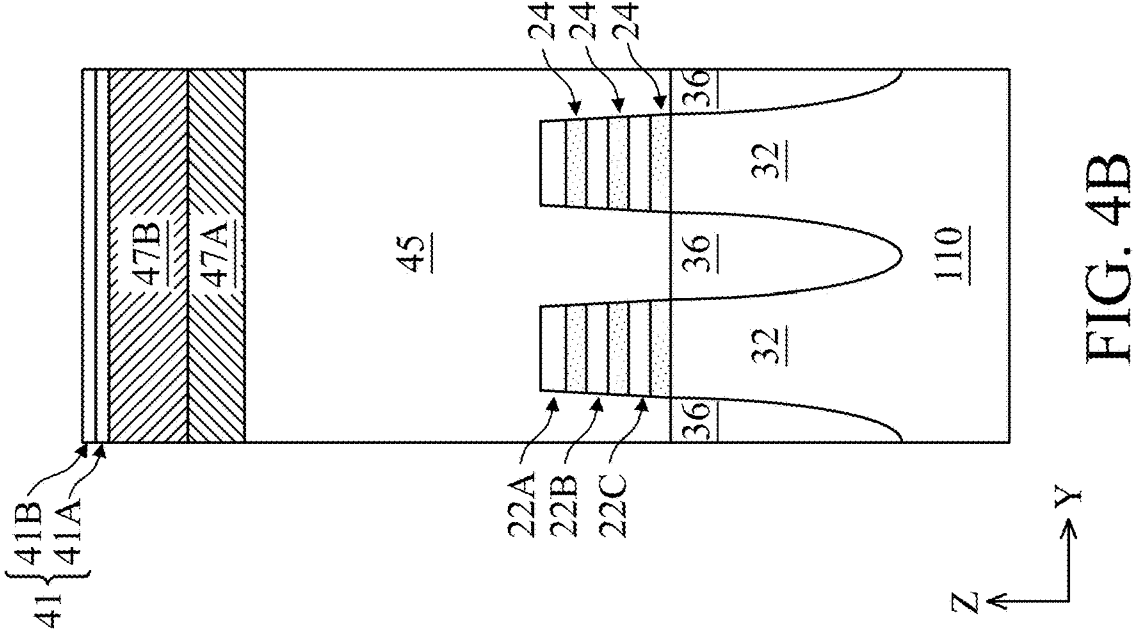

In FIGS. 4A-4C, dummy gate structures 40 are formed over the fins 32 and/or the nanostructures 22, 24. A dummy gate layer 45 is formed over the fins 32 and/or the nanostructures 22, 24. The dummy gate layer 45 may be made of materials that have a high etching selectivity versus the isolation regions 36. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. The mask layer 47 may include one or more layers, such as a first mask layer 47A and a second mask layer 47B, as shown in FIG. 4C. The first mask layer 47A may be formed in a first deposition process, and the second mask layer 47B may be formed in a second deposition process following the first deposition process. In some embodiments, a gate dielectric layer 43 is formed before the dummy gate layer 45 between the dummy gate layer 45 and the fins 32 and/or the nanostructures 22, 24.

A spacer layer 41 is formed over sidewalls of, and covering, the mask layer 47 and the dummy gate layer 45. The spacer layer 41 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. In some embodiments, the spacer layer 41 includes one or more material layers, as shown in FIGS. 4A-4B. For example, the spacer layer 41 may include a first spacer layer 41A in contact with the dummy gate structures 40, and a second spacer layer 41B in contact with the first spacer layer 41A. The first spacer layer 41A may be formed in a first deposition process, and the second spacer layer 41B may be formed in a second deposition process following the first deposition process. Portions of the spacer material layer between dummy gate structures 40 are removed using an anisotropic etching process, in accordance with some embodiments.

FIGS. 4A-4C illustrate one process for forming the spacer layer 41. In some embodiments, the spacer layer 41 is formed alternately or additionally after removal of the dummy gate layer 45. In such embodiments, the dummy gate layer 45 is removed, leaving an opening, and the spacer layer 41 may be formed by conformally coating material of the spacer layer 41 along sidewalls of the opening. The conformally coated material may then be removed from the bottom of the opening corresponding to the top surface of the uppermost channel, e.g., the channel 22A, prior to forming an active gate, such as the gate structure 200.

Figure 5A:
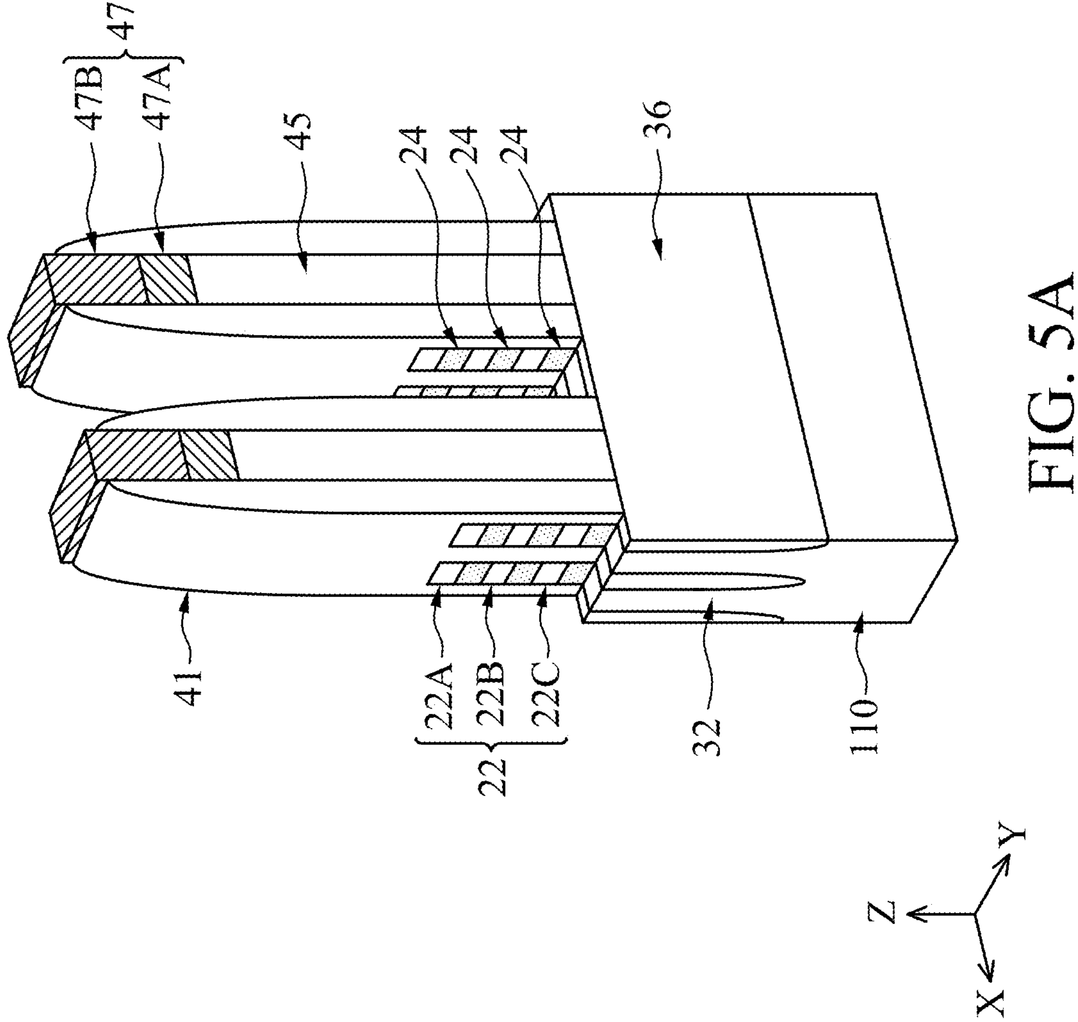
Figure 5C:
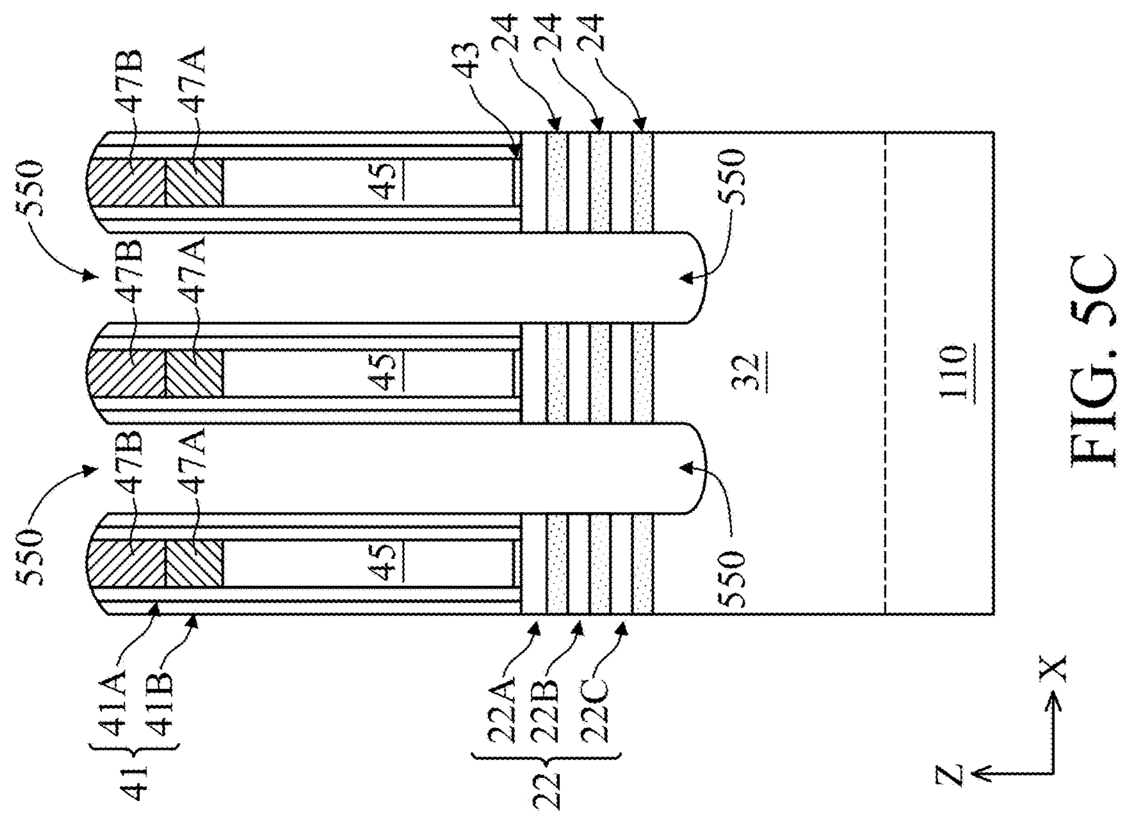
Figure 5B:
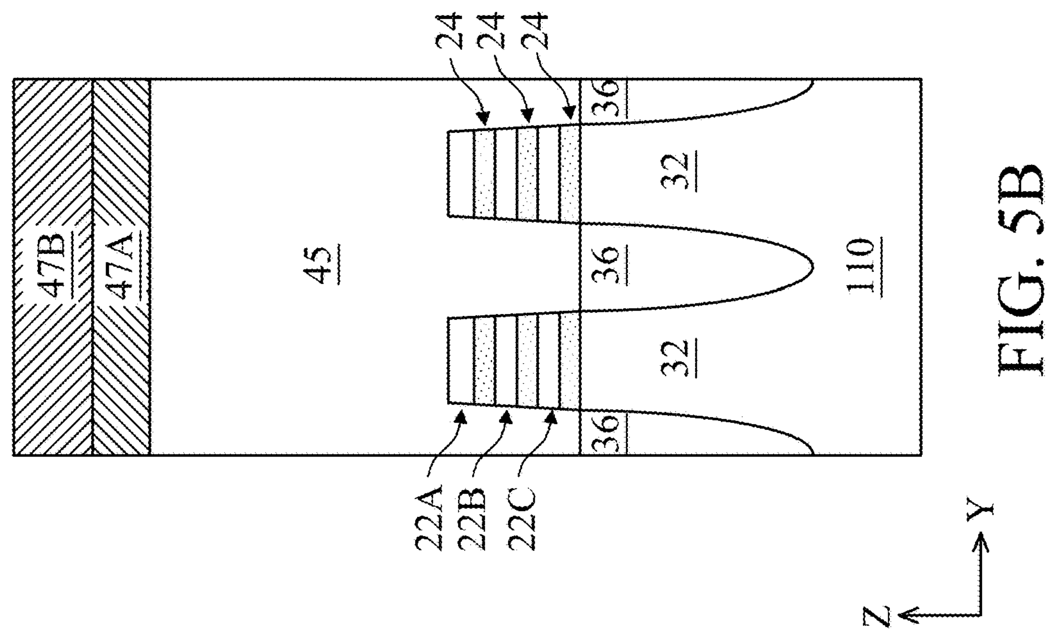

In FIGS. 5A-5C, an etching process is performed to etch the portions of protruding fins 32 and/or nanostructures 22, 24 that are not covered by dummy gate structures 40, resulting in the structure shown. The recessing may be anisotropic, such that the portions of fins 32 directly underlying dummy gate structures 40 and the spacer layer 41 are protected, and are not etched. The top surfaces of the recessed fins 32 may be substantially coplanar with the top surfaces of the isolation regions 36 as shown, in accordance with some embodiments. The top surfaces of the recessed fins 32 may be lower than the top surfaces of the isolation regions 36, in accordance with some other embodiments. FIG. 5C shows three vertical stacks of nanostructures 22, 24 following the etching process for simplicity. In general, the etching process may be used to form any appropriate number of vertical stacks of nanostructures 22, 24 over the fins 32. Openings 550 are formed by recessing of the fins 32. End portions of the nanostructures 22, 24 are exposed by the openings 550.

FIGS. 6A-6N and 7A-7M illustrate formation of inner spacers 74 and protective liner layers 78. In FIGS. 6A-6C, a selective etching process is performed to recess end portions of the nanostructures 24 exposed by the openings 550 without substantially attacking the nanostructures 22, corresponding to act 1400 of FIG. 9. After the selective etching process, recesses 64 are formed in the nanostructures 24 at locations where the removed end portions used to be. The resulting structure is shown in FIGS. 6A-6C.

In FIGS. 6D, 6E, following formation of the recesses 64 by removing the end portions of the nanostructures 24 exposed by the openings 550, an optional expanding operation may be performed to expand the recesses 64 by trimming exposed portions of the nanostructures 22, corresponding to act 1500 of FIG. 9. In some embodiments, the expanding operation includes one or more selective etching processes that thin the nanostructures 22 (e.g., in the Z-axis direction) without substantially attacking the nanostructures 24. FIG. 6E is a detailed view of a region 650 of FIG. 6D. After the selective etching process, the recesses 64 are expanded in the Z-axis direction by twice a depth $D_{225}$ shown in FIG. 6E. The depth $D_{225}$ corresponds to vertical dimension of a removed portion or notch 225 of the nanostructures 22 on a single side of the nanostructure, such as the nanostructure 22B shown in FIG. 6E. In some embodiments, the depth $D_{225}$ is in a range of about 1 nm to about 2 nm. Generally, the recesses 64 are expanded in the vertical direction without substantial expansion along the lateral direction (e.g., the X-axis direction).

In FIGS. 6F, 6G, the liner layer 78 is formed on sidewalls of the nanostructures 22 and in the recesses 64, corresponding to act 1500B of FIG. 9. In the expanded view of portion 651 shown in FIG. 6G, the liner layer 78 is formed having thickness $T_{78}$. In some embodiments, the thickness $T_{78}$ is substantially the same as the depth $D_{225}$. The liner layer 78 may be formed to be thinner or thicker than the depth $D_{225}$. In some embodiments, the liner layer 78 is or comprises substantially the same semiconductor material as the nanostructures 22. The liner layer 78 may include, for example, silicon. In some embodiments, the liner layer 78 is deposited or grown conformally on exposed portions of the nanostructures 22, 24. The liner layer 78 may be epitaxially grown on the exposed portions. Formation of the liner layer 78 may include a timed process, such that the liner layer 78 is formed to an appropriate thickness without completely filling the recesses 64. Forming the liner layer 78 protects the nanostructures 22, 24 from impurities being driven in in subsequent processes.

In FIG. 6H, an inner spacer layer is formed to fill remaining portions of the recesses 64, corresponding to act 1600 of FIG. 9. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses 64 in the nanostructures 24. The remaining portions of the inner spacer layers (e.g., portions disposed inside the recesses 64 in the nanostructures 24) form the inner spacers 74. The resulting structure is shown in FIG. 6H. Following formation of the inner spacers 74, inner sidewalls and vertical surfaces of the inner spacers 74 contact the liner layer 78. In some embodiments, formation of the inner spacer layer introduces impurities, such as phosphorous, in the inner spacers 74. In subsequent thermal processes, such as epitaxial growth of the source/drain regions 82 or annealing of the device 10, the phosphorous impurities may be driven in and aggregate in the nanostructures 22. When the nanostructures 22 are silicon nanosheets that are channels of NMOS transistors, the aggregation of impurities, such as phosphorous, degrade mobility of the NMOS transistors. The liner layer 78 prevents the impurities from being driven in to the nanostructures 22.

FIGS. 6I, 6J illustrate formation of source/drain regions 82 corresponding to act 1700 of FIG. 9. In the illustrated embodiment, the source/drain regions 82 are epitaxially grown from epitaxial material(s) in two operations, shown in FIG. 6I and FIG. 6J, respectively. In a first operation, base regions 82A are formed in portions of the openings 550 below the upper surface of the fin 32. In some embodiments, the base regions 82A of the source/drain regions 82 are formed by epitaxial growth of a material having similar composition as the fin 32. In some embodiments, the base region 82A includes undoped silicon, silicon carbide, silicon phosphide, silicon germanium or other suitable material, which may be epitaxially grown in, for example, a low-pressure CVD (LPCVD) process. After growing the base regions 82A, the base regions 82A may have upper surfaces substantially level with the interface of the fins 32 with the nanostructures 24, as shown in FIG. 6I.

In FIG. 6J, upper regions 82B of the source/drain regions 82 are formed in a second operation that may be different from the first operation used to form the base regions 82A. In some embodiments, the second operation grows a different material than that of the base regions 82A. The second operation may include an LPCVD deposition of a material, such as silicon carbide, silicon phosphide, silicon germanium, or other suitable material. In some embodiments, the upper regions 82B include similar elemental components (e.g., silicon and carbide) as the base regions 82A, and molar ratios of one of the elemental components (e.g., carbon) in the base regions 82A and the upper regions 82B are different. In some embodiments, visible interfaces are present where the base regions 82A contact the upper regions 82B.

In some embodiments, the source/drain regions 82 exert stress in the respective channels 22A-22C, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 32. For n-type devices, epitaxial growth of the source/drain regions 82, which is a high-temperature process, can lead to drive-in of phosphorous impurities, for example, when forming SiP or SiCP. The liner layer 78 prevents the drive-in of impurities from aggregating in the nanostructures 22. In some embodiments, the impurities are driven into the liner layer 78, and the liner layer 78 includes a higher molar ratio of impurities, such as phosphorous, than the nanostructures 22.

The source/drain regions 82 may be implanted with dopants followed by an anneal. The source/drain regions may have an impurity concentration of between about $10^{19}$ $cm^{-3}$ and about $10^{21}$ $cm^{-3}$. N-type and/or p-type impurities for source/drain regions 82 may be any of the impurities previously discussed. In some embodiments, the source/drain regions 82 are in situ doped during growth. Following formation of the source/drain regions 82 for n-type devices including impurities, such as phosphorous, the impurities may be driven in by the anneal. The liner layer 78 protects the nanostructures 22 from aggregation of impurities that would reduce mobility. In some embodiments, the impurities are driven into the liner layer 78, and the liner layer 78 includes impurities at a greater concentration than the nanostructures 22.

Figure 6K:
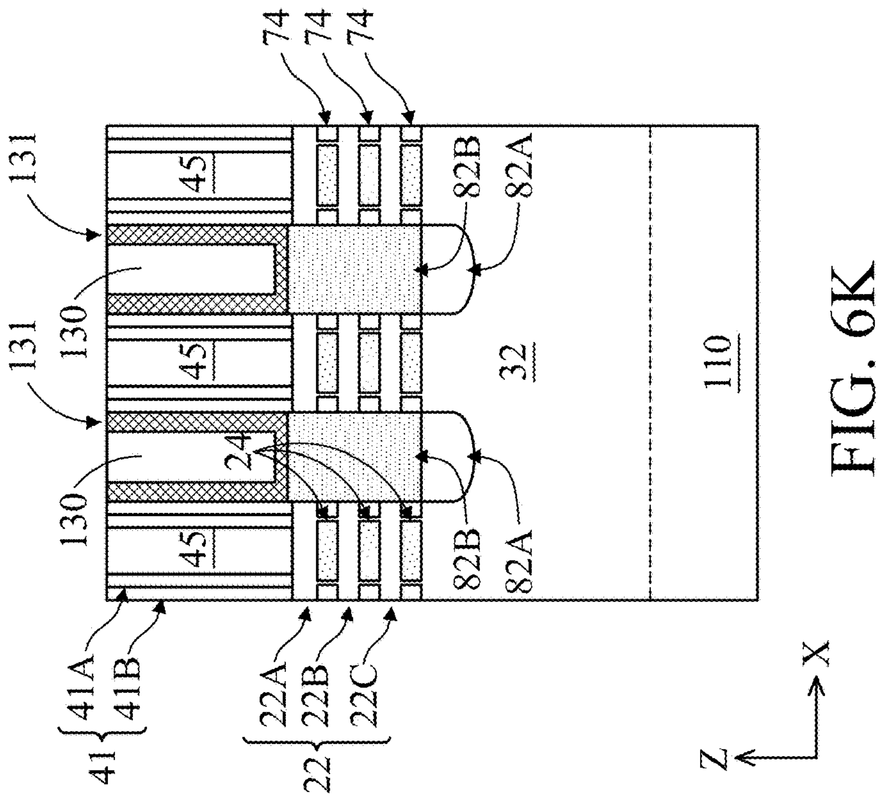

In FIG. 6K, a contact etch stop layer (CESL) 131 and interlayer dielectric (ILD) 130 may then be formed covering the dummy gate structures 40 and the source/drain regions 82. The CESL 131 may be deposited as a conformal layer in a first operation, for example, by a PVD, CVD, ALD or other suitable process. Following the first operation, the CESL 131 may cover sidewalls of the spacer layer 41 and upper surfaces of the source/drain regions 82. In a second operation, the ILD 130 may be deposited by a PVD, CVD, ALD or other suitable process. Following deposition of the ILD 130, a removal process, such as a CMP, may be performed to remove portions of the mask layer 47 and the spacer layer 41 overlying the dummy gate layer 45, such that an upper surface of the dummy gate layer 45 is exposed. The removal process planarizes upper surfaces of the spacer layer 41, the dummy gate layer 45, the CESL 131 and the ILD 130.

FIG. 6L illustrates release of fin channels 22A-22C by removal of the nanostructures 24, the mask layer 47, the dummy gate layer 45 and the dummy gate dielectric 43. The dummy gate layer 45 is removed in an etching process, so that recesses 92 are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric 43, when present, may be used as an etch stop layer when the dummy gate layer 45 is etched. The dummy gate dielectric 43 may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). The nanosheets may be collectively referred to as the channels 22 of the GAA device 20 formed.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanostructures 24 are removed and the nanostructures 22 are patterned to form channel regions of both PFETs and NFETs. However, in some embodiments the nanostructures 24 may be removed and the nanostructures 22 may be patterned to form channel regions of NFETs, and nanostructures 22 may be removed and the nanostructures 24 may be patterned to form channel regions of PFETs. In some embodiments, the nanostructures 22 may be removed and the nanostructures 24 may be patterned to form channel regions of NFETs, and the nanostructures 24 may be removed and the nanostructures 22 may be patterned to form channel regions of PFETs. In some embodiments, the nanostructures 22 may be removed and the nanostructures 24 may be patterned to form channel regions of both PFETs and NFETs.

In some embodiments, the nanosheets 22 are reshaped (e.g., thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Figure 6N:
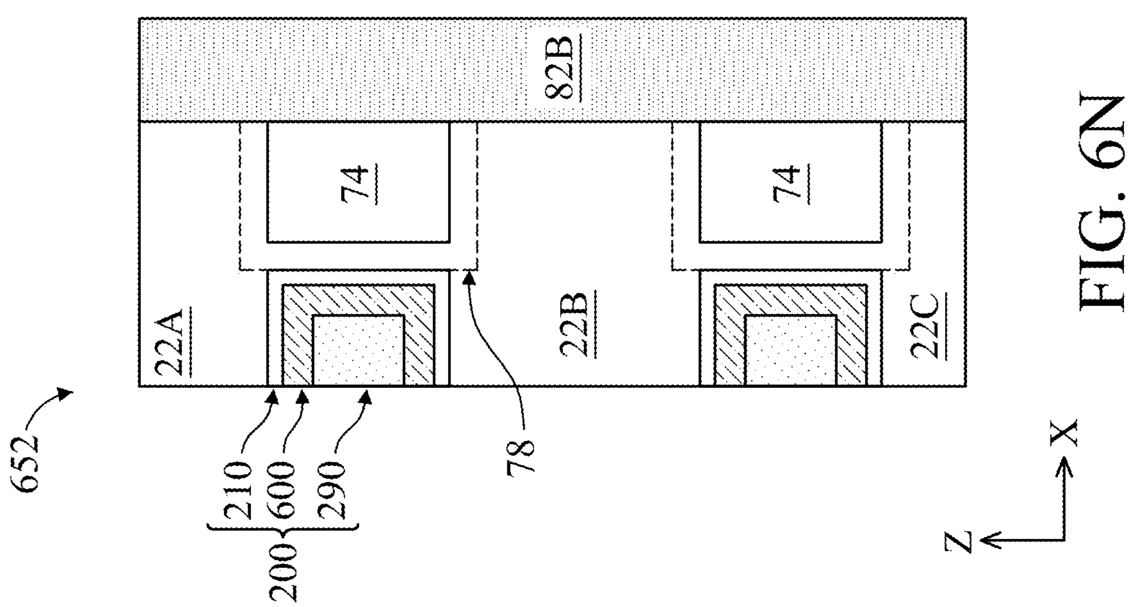
Figure 6M:
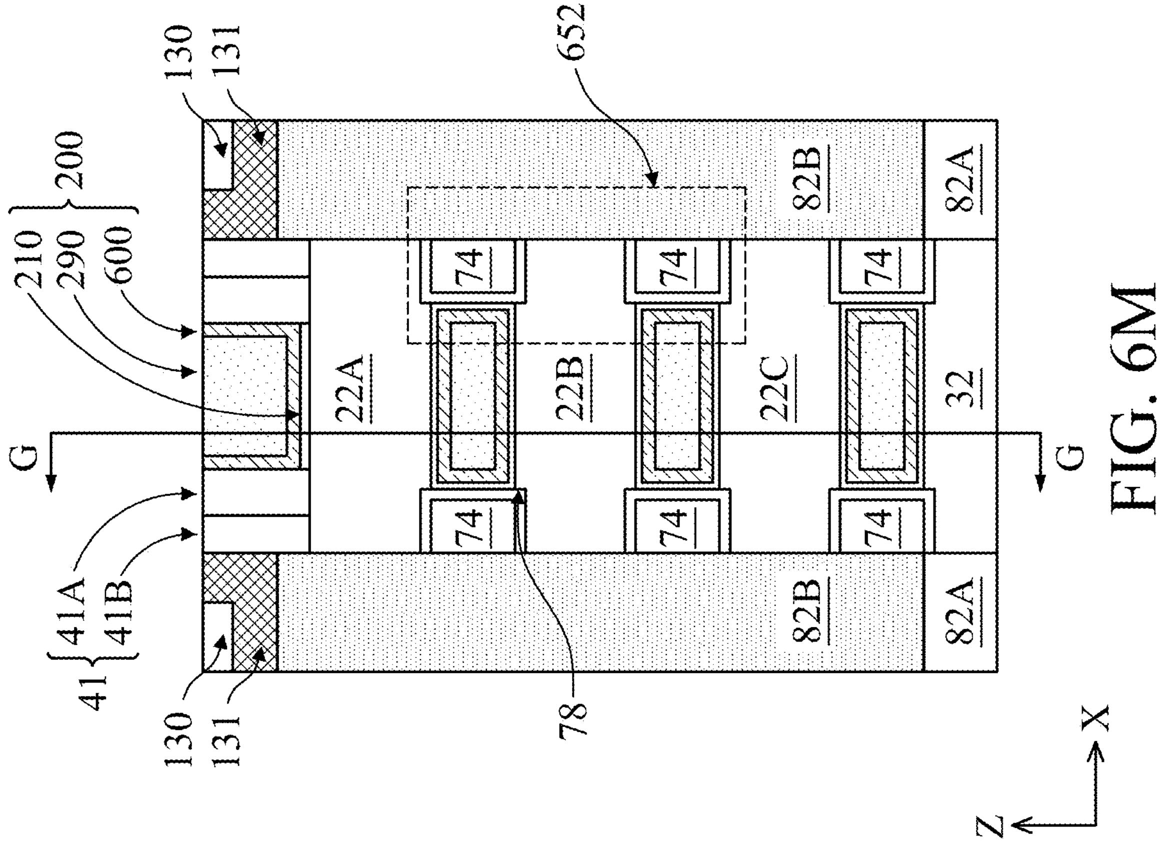

In FIGS. 6M, 6N, a replacement gate 200 is formed, corresponding to act 1800 of FIG. 9. FIG. 6N is a detailed view of the region 652 of FIG. 6M corresponding to a portion of the gate structure 200. The gate structure 200 generally includes the interfacial layer (IL, or "first IL" below) 210, at least one gate dielectric layer 600 and the gate fill layer 290. In some embodiments, each replacement gate 200 further includes one or more of a work function tuning layer 900, a second interfacial layer 240 and/or a second work function layer 700, described below with reference to FIG. 8.

As shown in FIGS. 6M, 6N, the first IL 210 is formed on exposed surfaces of the fin 32, the nanostructures 22A-22C and the liner layer 78. In some embodiments, the first IL 210 includes an oxide of the semiconductor material of the liner layer 78, the nanostructures 22 and the fin 32, e.g., silicon oxide. In some embodiments, the liner layer 78 has different material composition than the nanostructures 22 and/or the fin 32. As such, a portion of the interfacial layer 210 in contact with the liner layer 78 has a different material composition than a portion of the interfacial layer 210 in contact with the nanostructure channels 22 or the fin 32. For example, the nanostructure channels 22 may include substantially pure silicon, and the liner layer 78 may include silicon mixed with another component, such as germanium, carbon, phosphorous, or the like. When the interfacial layer 210 is grown on the liner layer 78, the portion of the interfacial layer 210 on the liner layer 78 may include an oxide of the liner layer 78 material, such as SiGeO, SiCO, SiPO, or the like. In other embodiments, the first IL 210 may include another suitable type of dielectric material. The first IL 210 has a thickness in a range between about 5 angstroms and about 50 angstroms. The first IL 210 may be formed by oxidizing exposed surfaces of the nanostructures 22, the fin 32 and the liner layer 78. The first IL 210 includes horizontal portions on upper and lower surfaces of the nanostructures 22A-22C and upper surfaces of the fin 32. The first IL 210 includes vertical portions on inner sidewalls of the liner layer 78. Outer sidewalls of the liner layer 78 are in contact with the inner spacers 74. In configurations not including the liner layer 78, the first IL 210 generally does not grow on the exposed inner sidewalls of the inner spacers 74. However, the liner layer 78 includes substantially the same material as the nanostructures 22 (e.g., silicon), such that the first IL 210 grows on the liner layer 78 during oxidation of the nanostructures 22.

Following formation of the first IL 210, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses HfCl4 and/or H2O as precursors. Such an ALD process may form the first gate dielectric layer 220 to have a thickness in a range between about 10 angstroms and about 100 angstroms.

In some embodiments, the gate dielectric layer 600 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process.

FIGS. 6M, 6N further illustrate the metal fill layer 290. In some embodiments, a glue layer (not separately illustrated) is formed prior to forming the metal fill layer 290. The glue layer may promote and/or enhance the adhesion between the metal fill layer 290 and an underlying layer of the gate structure 200. In some embodiments, the glue layer may be formed of a metal nitride, such as TiN, TaN, MoN, WN, or another suitable material, using ALD. In some embodiments, thickness of the glue layer is between about 10 A and about 25 A. The metal fill layer 290 may be formed on the glue layer, and may include a conductive material such as tungsten, cobalt, ruthenium, iridium, molybdenum, copper, aluminum, or combinations thereof. In some embodiments, the metal fill layer 290 may be deposited using methods such as CVD, PVD, plating, and/or other suitable processes. Composition and structure of the gate structure 200 is described in greater detail with reference to FIG. 8.

FIGS. 7A-7M illustrate formation of the inner spacers 74 in a process in which the optional act 1500A is omitted. The process shown in FIGS. 7A-7C is substantially the same as described with reference to FIGS. 6A-6C.

FIG. 7D is a detailed view of a region 750 shown in FIG. 7C. Starting from FIG. 7D, because the optional act 1500A in which the recesses 64 are expanded is omitted, the nanostructures 22A-22C are substantially unchanged following formation of the recesses 64. As such, upper surfaces of end portions and a central portion of the nanostructure 22B are substantially coplanar, at a level $L_{22BU}$ shown in FIG. 7D. Lower surfaces of the end portions and the central portion are also substantially coplanar, at a level $L_{22BL}$ shown in FIG. 7D.

In FIG. 7E and FIG. 7F, the liner layer 78 is deposited on the exposed surfaces of the nanostructures 22, 24 and the fin 32. FIG. 7F is a detailed view of a region 751 shown in FIG. 7E. Formation and structure of the liner layer 78 may be similar in many respects to that described with reference to FIG. 6F. The liner layer 78 may be formed having the thickness $T_{78}$, which may be in a range of about 0.5 nm to about 2 nm. In the configuration illustrated in FIG. 7E, the optional act of expanding the recesses 64 is omitted, which simplifies the process for forming the inner spacers 74 by removing a manufacturing step. However, the remaining portion of the recesses 64 may be narrower along the vertical axis (e.g., in the Z-axis direction). As such, aspect ratio of the remaining portions may be higher, which may increase difficulty in filling the remaining portion of the recesses 64.

The process shown in FIGS. 7G-7K is substantially the same as described with reference to FIGS. 6H-6L. Reduced height of the inner spacers 74 along the Z-axis direction may promote better epitaxial growth of the source/drain regions 82, as the material of the source/drain regions 82 has a greater preference for growth on silicon than on the dielectric material of the inner spacers 74. By reducing surface area of the inner spacers 74 exposed to the epitaxial growth process, the source/drain regions 82 grown on surrounding silicon (e.g., of the liner layer 78) may merge more quickly.

Figure 7M:
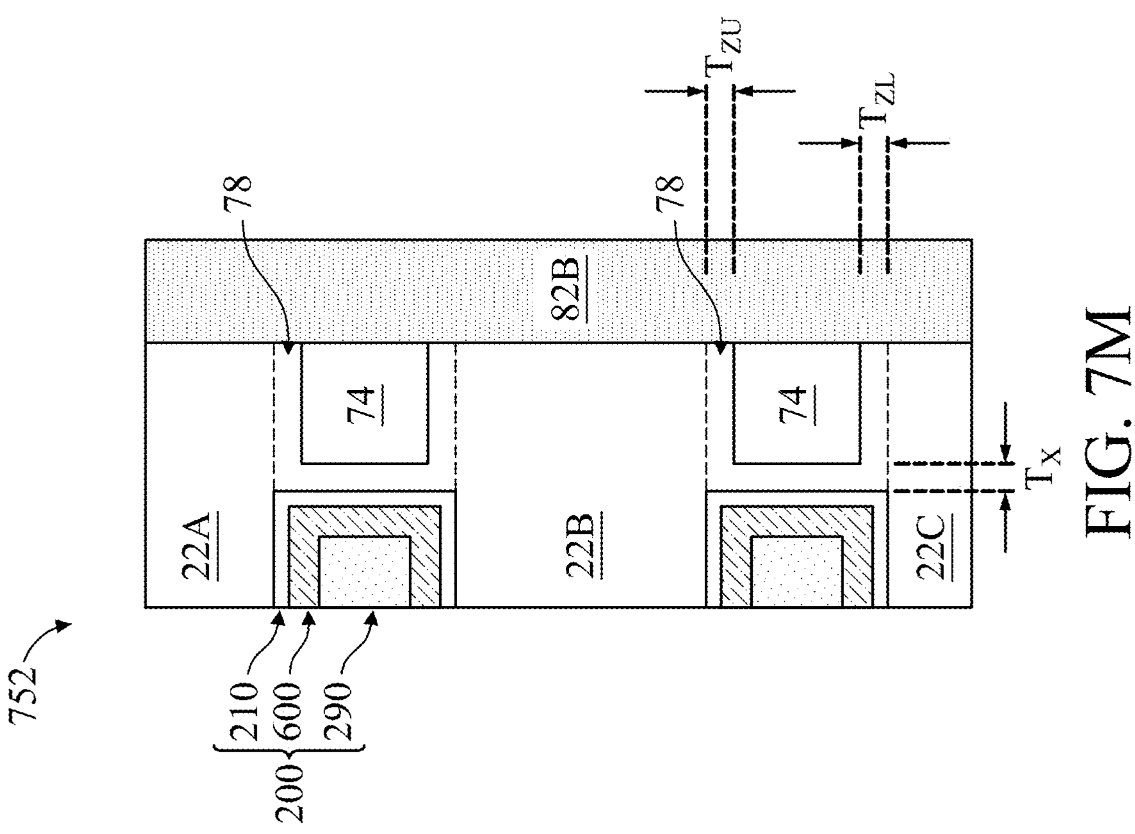

Picking up again in FIGS. 7L, 7M, formation of the gate structure 200 is substantially similar to that described with reference to FIGS. 6N, 6M. FIG. 7M is a detailed view of a region 752 shown in FIG. 7L. In the view of FIG. 7M, it can be seen that the inner spacers 74 have smaller dimension along the vertical axis (e.g., the Z-axis) than the gate structure 200 between the nanostructures 22 (e.g., between the nanostructure 22A and the nanostructure 22B). In some embodiments, the difference in height between the nanostructures 22 of the gate structure 200 and the inner spacers 74 may be in a range of about 2 nm to about 4 nm, corresponding to the sum of the thicknesses $T_{ZU}$, $T_{ZL}$ of the liner layer 78 on upper and lower surfaces of the nanostructures 22.

FIG. 8 is a partial perspective side view of the gate structure 200 and the nanostructures 22A, 22B along the cross-section G-G shown in FIGS. 6M, 7L.

With reference to FIG. 8, in some embodiments, the first IL 210 includes an oxide of the semiconductor material of the substrate 110, e.g., silicon oxide. In other embodiments, the first IL 210 may include another suitable type of dielectric material. The first IL 210 has a thickness in a range between about 5 angstroms and about 50 angstroms.

Still referring to FIG. 8, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses HfCl4 and/or H2O as precursors. Such an ALD process may form the first gate dielectric layer 220 to have a thickness in a range between about 10 angstroms and about 100 angstroms.

In some embodiments, the gate dielectric layer 600 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the GAA devices 20A-20E.

With further reference to FIG. 8, a second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200, and serves to limit diffusion of metallic impurity from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfTiO, HfTaO, HAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of $WCl_5$, followed by an Ar purge, followed by a second pulse of $O_2$, followed by another Ar purge. The high-k capping layer is removed to increase gate fill window for further multiple threshold voltage tuning by metal gate patterning.

Further in FIG. 8, after forming the second IL 240 and removing the high-k capping layer, a work function barrier layer 700 is optionally formed on the gate structure 200, in accordance with some embodiments. The work function barrier layer 700 is or comprises a metal nitride, such as TiN, WN, MoN, TaN, or the like. In a specific embodiment, the work function barrier layer 700 is TiN. The work function barrier layer 700 may have thickness ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices.

The work function metal layer 900, which may include at least one of an N-type work function metal layer, an in-situ capping layer, or an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TiN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 8 further illustrates the metal fill layer 290. In some embodiments, a glue layer (not separately illustrated) is formed between the oxygen blocking layer of the work function metal layer and the metal fill layer 290. The glue layer may promote and/or enhance the adhesion between the metal fill layer 290 and the work function metal layer 900. In some embodiments, the glue layer may be formed of a metal nitride, such as TiN, TaN, MoN, WN, or another suitable material, using ALD. In some embodiments, thickness of the glue layer is between about 10 A and about 25 A. The metal fill layer 290 may be formed on the glue layer, and may include a conductive material such as tungsten, cobalt, ruthenium, iridium, molybdenum, copper, aluminum, or combinations thereof. In some embodiments, the metal fill layer 290 may be deposited using methods such as CVD, PVD, plating, and/or other suitable processes. In some embodiments, a seam 510, which may be an air gap, is formed in the metal fill layer 290 vertically between the channels 22A, 22B. In some embodiments, the metal fill layer 290 is conformally deposited on the work function metal layer 900. The seam 510 may form due to sidewall deposited film merging during the conformal deposition. In some embodiments, the seam 510 is not present between the neighboring channels 22A, 22B.

Additional processing may be performed to finish fabrication of the GAA device 20. For example, gate contacts may be formed that electrically couple to the gate structure 200, and source/drain contacts may be formed that electrically couple to the source/drain regions 82. An interconnect structure may then be formed over the source/drain contacts and the gate contacts. The interconnect structure may include a plurality of dielectric layers surrounding metallic features, including conductive traces and conductive vias, which form electrical connection between devices on the substrate 110, such as the GAA device 20, as well as to IC devices external to the IC device 10. In some embodiments, the conductive layer 204 (see FIG. 1A and FIG. 1B) is present over the gate structure 200. In some embodiments, capping layers are present over the gate structure 200 (e.g., capping layer 295 over the conductive layer 204; see FIG. 1A and FIG. 1B) and/or the source/drain contacts 120. Configurations in which the capping layers 295 are only present over the gate structure 200 (e.g., no second capping layers are present over the source/drain contacts) may be considered "single SAC" structures, and configurations in which the capping layers are present over gate structures 200 and source/drain contacts 120 may be considered "double SAC" structures.

Embodiments may provide advantages. By forming the liner layer 78 over exposed surfaces of the nanostructures 24 in the recesses 64 in which the inner spacers 74 are to be formed, the nanostructures 22, 24 may be protected from impurities that are driven in in subsequent processing operations. For NMOS transistors, the reduction or elimination of such impurities improves mobility, which improves overall performance of the device 10.

In accordance with at least one embodiment, a device includes: a substrate; a first nanostructure channel above the substrate; a second nanostructure channel between the first nanostructure channel and the substrate; an inner spacer between the first nanostructure channel and the second nanostructure channel; a gate structure abutting the first nanostructure channel, the second nanostructure channel and the inner spacer; and a liner layer between the inner spacer and the gate structure.

In accordance with at least one embodiment, a device includes: a substrate; a semiconductor nanosheet above the substrate; a first inner spacer above the semiconductor nanosheet; a second inner spacer below the semiconductor nanosheet; a first liner layer between the semiconductor nanosheet and the first inner spacer; and a second liner layer between the semiconductor nanosheet and the second inner spacer.

In accordance with at least one embodiment, a method includes: forming a vertical stack of alternating first nanosheets and second nanosheets over a substrate; forming recesses by removing end portions of the second nanosheets; forming a liner layer in the recesses; and forming an inner spacer in each of the recesses, the inner spacer contacting the liner layer on three sides.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

a nanostructure channel;

an inner spacer above or below the nanostructure channel;

a gate structure abutting the nanostructure channel and the inner spacer; and a liner layer between the inner spacer and the gate structure, the liner layer and the nanostructure channel include substantially the same material.

2. The device of claim 1, wherein an upper surface of the liner layer is substantially coplanar with a lower surface of the nanostructure channel.

3. The device of claim 1, wherein a lower surface of the liner layer is substantially coplanar with an upper surface of the nanostructure channel.

4. The device of claim 1, wherein the gate structure includes an interfacial layer in contact with the nanostructure channel and the liner layer.

5. The device of claim 4, wherein a portion of the interfacial layer in contact with the liner layer has a different material composition than a portion of the interfacial layer in contact with the nanostructure channel.

6. The device of claim 1, wherein end portions of the nanostructure channel are thinner in a vertical direction than a middle portion of the nanostructure channel.

7. The device of claim 6, wherein an upper surface of the liner layer is at a different level than a lower surface of the nanostructure channel.

8. The device of claim 1, wherein the liner layer has a thickness in a range of about 1 nanometer (nm) to about 2 nm.

9. The device of claim 1, further comprising a source/drain region in contact with the nanostructure channel, the liner layer, and the inner spacer.

10. A device comprising:

a semiconductor nanosheet;

a first inner spacer above the semiconductor nanosheet;

a second inner spacer below the semiconductor nanosheet;

a first liner layer between the semiconductor nanosheet and the first inner spacer; and a second liner layer between the semiconductor nanosheet and the second inner spacer, wherein each of the first liner layer and the second liner layer includes a semiconductive material.

11. The device of claim 10, further comprising:

a gate structure region above the semiconductor nanosheet, the gate structure region having substantially the same height as the first inner spacer.

12. The device of claim 10, wherein each of the first and second liner layers has a thickness in a range of about 1 nanometer (nm) to about 2 nm.

13. The device of claim 10, further comprising:

a source/drain region in contact with the semiconductor nanosheet, the first and second inner spacers, and the first and second liner layers.

14. A method, comprising:

forming a vertical stack of alternating first nanosheets and second nanosheets over a substrate;

forming recesses by removing end portions of the second nanosheets; and forming a liner layer in the recesses, including:

depositing a semiconductive material in the recesses; and forming an inner spacer in each of the recesses.

15. The method of claim 14, further comprising:

expanding the recesses by trimming end portions of the first nanosheets prior to forming the liner layer.

16. The method of claim 14, further comprising:

forming gaps between the first nanosheets by removing the second nanosheets; and forming a gate structure in the gaps.

17. The method of claim 16, wherein the forming a gate structure includes:

forming an interfacial layer on surfaces of the first nanosheets and the liner layer exposed by the gaps.

18. The method of claim 17, wherein the forming a gate structure includes:

forming a gate dielectric layer on the interfacial layer; and forming a metal fill layer on the gate dielectric layer.

19. The method of claim 18, further comprising:

forming a source/drain region in contact with the first nanosheets, the liner layer, and the inner spacer.

20. The method of claim 14, wherein the liner layer has a thickness in a range of about 1 nanometer (nm) to about 2 nm.

* * * * *